United States Patent
Do et al.

(10) Patent No.: US 8,841,173 B2
(45) Date of Patent: Sep. 23, 2014

(54) INTEGRATED CIRCUIT PACKAGING SYSTEM WITH LEADFRAME LEAD ARRAY ROUTING AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/427,598

(22) Filed: Mar. 22, 2012

(65) Prior Publication Data

US 2013/0099365 A1    Apr. 25, 2013

Related U.S. Application Data

(60) Provisional application No. 61/549,347, filed on Oct. 20, 2011.

(51) Int. Cl.
*H01L 21/50* (2006.01)
*H01L 21/56* (2006.01)
*H01L 23/495* (2006.01)
*H01L 21/48* (2006.01)

(52) U.S. Cl.
CPC ..... *H01L 21/568* (2013.01); *H01L 2924/18161* (2013.01); *H01L 2924/10253* (2013.01); *H01L 2224/32145* (2013.01); *H01L 2224/48247* (2013.01); *H01L 2224/32245* (2013.01); *H01L 23/49548* (2013.01); *H01L 2224/16245* (2013.01); *H01L 2224/73265* (2013.01); *H01L 21/4832* (2013.01); *H01L 2924/15311* (2013.01); *H01L 23/49575* (2013.01); *H01L 23/49582* (2013.01)
USPC ................ 438/124; 361/809; 257/E21.499; 29/877

(58) Field of Classification Search
CPC ....................................................... H01L 21/50
USPC ......... 438/111, 106, 112, 119, 123, 124, 687, 438/121, 118, 127; 257/E21.504, E21.506, 257/E21.509, E21.499, E21.141, E23.135, 257/676, 666, 784, 787
See application file for complete search history.

(56) References Cited

U.S. PATENT DOCUMENTS

| | | | |
|---|---|---|---|
| 6,700,210 B1 | 3/2004 | Smith | |
| 7,060,535 B1 | 6/2006 | Sirinorakul et al. | |
| 7,892,894 B2 | 2/2011 | Do et al. | |
| 7,964,450 B2 | 6/2011 | Camacho et al. | |
| 2009/0034225 A1* | 2/2009 | Shoji et al. | 361/809 |
| 2010/0314741 A1 | 12/2010 | Lee et al. | |

OTHER PUBLICATIONS

U.S. Appl. No. 13/102,041, filed May 5, 2011, Do et al.
U.S. Appl. No. 13/326,806, filed Dec. 15, 2011, Do et al.

* cited by examiner

*Primary Examiner* — David Vu
*Assistant Examiner* — Mouloucoulaye Inoussa
(74) *Attorney, Agent, or Firm* — Ishimaru & Associates LLP

(57) ABSTRACT

A method of manufacture of an integrated circuit packaging system includes: providing a leadframe with a grid lead and a support pad; connecting a redistribution layer to the grid lead, the redistribution layer over the support pad; mounting an integrated circuit over the redistribution layer; applying an encapsulation on the redistribution layer, the redistribution layer in an interior area of the leadframe and the interior area under the integrated circuit; forming a support pad residue on the bottom surface of the redistribution layer by removing the support pad under the encapsulation and the interior redistribution layer; and forming an insulation layer on the support pad residue and the grid lead.

8 Claims, 13 Drawing Sheets

INTEGRATED CIRCUIT PACKAGING SYSTEM WITH LEADFRAME LEAD ARRAY ROUTING AND METHOD OF MANUFACTURE THEREOF

CROSS-REFERENCE TO RELATED APPLICATION

This application claims the benefit of U.S. Provisional Patent Application Ser. No. 61/549,347 filed Oct. 20, 2011, and the subject matter thereof is incorporated herein by reference thereto.

TECHNICAL FIELD

The present invention relates generally to an integrated circuit packaging system, and more particularly to a system with leadframe connectivity.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Research and development strategies focus on new technologies as well as on improving the existing and mature technologies. Research and development in the existing technologies can take a myriad of different directions.

Modern electronics requirements demand increased functionality in an integrated circuit package while providing less physical space in the system. While these approaches provide more functions within an integrated circuit, they do not fully address the requirements for lower height, smaller space, and cost reduction.

One way to reduce cost is to use mature package technologies with existing manufacturing methods and equipment. The reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. Ever-increasing commercial competitive pressures, along with growing consumer expectations, make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe with a grid lead and a support pad; connecting a redistribution layer to the grid lead, the redistribution layer over the support pad; mounting an integrated circuit over the redistribution layer; applying an encapsulation on the redistribution layer, the redistribution layer in an interior area of the leadframe and the interior area under the integrated circuit; forming a support pad residue on the bottom surface of the redistribution layer by removing the support pad under the encapsulation and the interior redistribution layer; and forming an insulation layer on the support pad residue and the grid lead.

The present invention provides an integrated circuit packaging system, including: a grid lead; an integrated circuit connected to the grid lead; a redistribution layer, having a support pad residue on the bottom surface of the redistribution layer, connected to the integrated circuit in an interior area and the interior area under the integrated circuit; an encapsulation on the redistribution layer, the grid lead, and the integrated circuit; and an insulation layer on the support pad residue, the redistribution layer, the encapsulation, and the grid lead.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
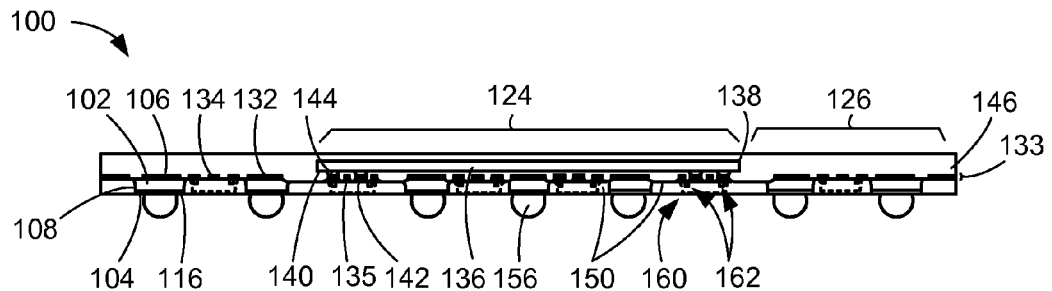
FIG. 1 is a cross-sectional view of an integrated circuit packaging system along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

Figure 2:
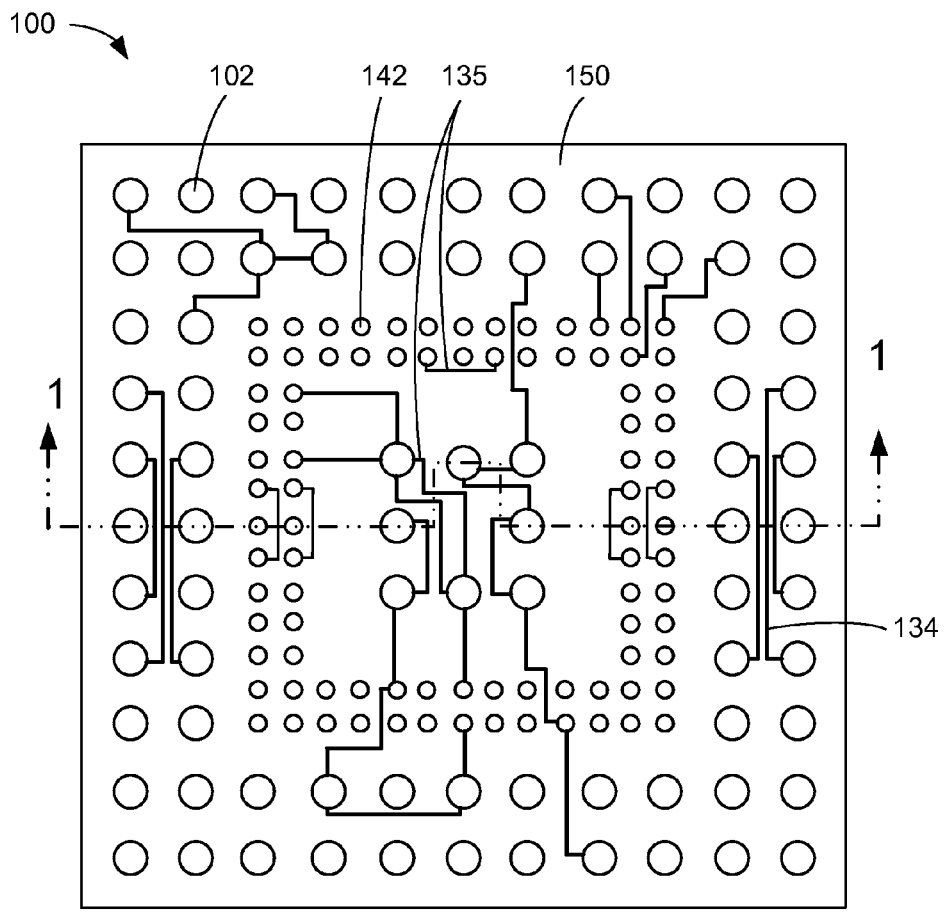
FIG. 2 is an exemplary top plan view of the integrated circuit packaging system.

Referring now to FIG. 1, therein is shown a cross-sectional view of an integrated circuit packaging system 100 along line 1-1 of FIG. 2 in a first embodiment of the present invention. The integrated circuit packaging system 100 can include a leadframe lead array.

The integrated circuit packaging system 100 can include a grid lead 102. The grid lead 102 is a structure that provides connectivity for electrical signals or electrical potential levels between opposite sides of the integrated circuit packaging system 100.

The grid lead 102 can include a grid lead bottom side 104 and a grid lead top side 106 opposite the grid lead bottom side 104. The grid lead 102 can include a grid lead non-horizontal side 108 extending between the grid lead bottom side 104 and the grid lead top side 106.

The grid lead 102 can include a grid lead bottom pad 116. The grid lead bottom pad 116 is an attachment site providing electrical connection to the bottom of the grid lead 102. The grid lead bottom pad 116 can be formed at the grid lead bottom side 104.

The grid lead 102 can include a grid lead top pad 132. The grid lead top pad 132 is an attachment site providing electrical connection to the top of the grid lead 102. The grid lead top pad 132 can be formed at the grid lead top side 106. For example, the grid lead bottom pad 116 and the grid lead top pad 132 can be a plating formed from a metal or metal alloy.

The integrated circuit packaging system 100 can include a redistribution layer 133. The redistribution layer 133 can include a terminal redistribution layer 134. The terminal redistribution layer 134 is a structure that provides electrical connectivity between the grid lead 102 and a semiconductor device. The terminal redistribution layer 134 can route electrical connections or redistribute electrical signals from an integrated circuit 136 to the grid lead 102.

The integrated circuit 136 is defined as a semiconductor device. The integrated circuit 136 can include an inactive side 138 and an active side 140 opposite the inactive side 138. The terminal redistribution layer 134 can be routed between the grid lead 102 and another of the grid lead 102. For example, the integrated circuit 136 can include a flipchip, a wire-bond chip, a silicon (Si) die, or other microelectronic device.

The integrated circuit packaging system 100 can include a plated land 142. The plated land 142 is defined as an electrically conductive structure for mounting the integrated circuit 136. The plated land 142 can provide electrical connectivity between the integrated circuit 136 and an external system.

The plated land 142 can be connected to the integrated circuit 136 with a land interconnect 144. The land interconnect 144 can be a structure for providing electrical connectivity between the integrated circuit 136 and the plated land 142. For example, the land interconnect 144 can be a solder ball, metal bump, bond wire, lead, solder bump, or a combination thereof. In an illustrative example, the integrated circuit 136 can include the land interconnect 144.

The integrated circuit packaging system 100 can include an interior area 124 and a terminal area 126. The interior area 124 is the portion of the integrated circuit packaging system 100 under a periphery of the integrated circuit 136. The interior area 124 can be the portion of the integrated circuit packaging system 100 within a periphery of a plurality of the plated land 142. The interior area 124 is between the integrated circuit 136 and a support pad 160.

The terminal area 126 can be the portion of the integrated circuit packaging system 100 outside the interior area 124. The terminal redistribution layer 134 can be formed in the terminal area 126.

The integrated circuit packaging system 100 can include the redistribution layer 133. The redistribution layer 133 can include an interior redistribution layer 135 formed in the interior area 124. The interior redistribution layer 135 is a structure that provides electrical connectivity for distributing electrical signals from the semiconductor device in the interior area 124.

The interior redistribution layer 135 can provide electrical connectivity between the integrated circuit 136, the plated land 142, another of the plated land 142, the grid lead 102, and the terminal redistribution layer 134. The terminal redistribution layer 134 and the interior redistribution layer 135 can be formed from the same structure, process, and material as the redistribution layer 133.

The interior redistribution layer 135 can be formed between the plated land 142 and another of the plated land 142. The terminal redistribution layer 134 can form electrical connections with the interior redistribution layer 135.

The integrated circuit 136 can include the active side 140 facing the plated land 142. The integrated circuit 136 can be mounted over the plated land 142 with the land interconnect 144 in direct contact with no intervening elements with the integrated circuit 136 and the plated land 142.

The integrated circuit packaging system 100 can include an encapsulation 146. The encapsulation 146 is defined as a package cover providing protection hermetic seal. The encapsulation 146 can be formed on the grid lead 102, the grid lead top pad 132, the terminal redistribution layer 134, the interior redistribution layer 135, the integrated circuit 136, and the land interconnect 144. The active side 140 of the integrated circuit 136 is facing the redistribution layer 133. The encapsulation 146 is directly on the redistribution layer 133 and the active side 140 of the integrated circuit 136. The redistribution layer 133 is separated from the active side 140 of the integrated circuit 136 exclusively by the encapsulation 146.

The encapsulation 146 can be formed in a variety of ways. For example, the encapsulation 146 can be formed using transfer molding, injection molding, vacuum molding, film assist molding, or a combination thereof. The encapsulation 146 can include materials such as a capillary underfill, a non-conductive paste (NCP), a molded underfill (MUF), or a combination thereof.

The formation of the encapsulation 146 can cause the integrated circuit packaging system 100 to bow or deform. The deformation or bowing can be prevented by forming a support pad 160 on the bottom side of the integrated circuit packaging system 100 for providing mechanical support during the formation of the encapsulation 146.

The support pad 160 can be directly under areas susceptible to deformation including the terminal redistribution layer 134, the interior redistribution layer 135, and the plated land 142. The location of the support pad 160 is indicated by the dashed lines below the terminal redistribution layer 134, the interior redistribution layer 135 and the plated land 142.

The support pad 160 can be removed in a later stage of manufacture, but upon close examination, the support pad 160 can leave a support pad residue 162 on the bottom surfaces of the terminal redistribution layer 134, the interior redistribution layer 135, and the plated land 142. The support pad residue 162 is defined as an irregular residual material from the support pad 160 and on the structures previously supported by the support pad 160 as a result of removing the support pad 160.

The support pad residue 162 can form irregular bottom surfaces of the terminal redistribution layer 134, the interior redistribution layer 135, and the plated land 142 characteristic of the removal of material. For example, the support pad residue 162 can include etch marks, partial outlines of the support pad 160, grooves, metal protrusions, or a combination thereof. The support pad residue 162 is exposed from planted land 142 and the redistribution layer 133 including the terminal redistribution layer 134 and the interior redistribution layer 135.

The integrated circuit packaging system 100 can include an insulation layer 150 for electrically protecting portions of the bottom surfaces of the terminal redistribution layer 134 and the interior redistribution layer 135. The insulation layer 150 can include an insulation material including a passivation, a solder resist, an epoxy, or an adhesive.

The insulation layer 150 can be formed between the grid lead 102 and another of the grid lead 102. The insulation layer 150 can be formed on portions of the grid lead 102, the terminal redistribution layer 134, the interior redistribution layer 135, and the encapsulation 146. The insulation layer 150 can electrically isolate the terminal redistribution layer 134, the grid lead 102, and the interior redistribution layer 135.

The integrated circuit packaging system 100 can include an external connector 156, for connecting the grid lead 102 to an external system (not shown). For example, the external connector 156 can be formed with a conductive material including solder, a metal, or a metallic alloy.

It has been discovered that the present invention provides wire span reduction, package size reduction, cost savings, and elimination of complex bond layout by connecting the terminal redistribution layer 134 with the interior redistribution layer 135, the grid lead 102, and the integrated circuit 136.

It has been discovered that the present invention provides increased routing area and routing functionality by having the interior redistribution layer 135 under the integrated circuit 136. The interior redistribution layer 135 can be used for routing electrical signals between the grid lead 102, the plated land 142, the terminal redistribution layer 134, and the integrated circuit 136.

It has been discovered that the present invention provides increased reliability by having the support pad 160 positioned to reduce bowing during the molding of the encapsulation 146. The regions around the terminal redistribution layer 134, the interior redistribution layer 135, and the plated land 142 can bow down to the level of the grid lead bottom pad 116 without support. The support pad 160 provides mechanical support during molding to reduce the bowing of the terminal redistribution layer 134, the interior redistribution layer 135, and the plated land 142 by up to 100% of the height of the support pad 160.

Referring now to FIG. 2, therein is shown an exemplary top plan view of the integrated circuit packaging system 100. The top plan view does not show the encapsulation 146 of FIG. 1 or the integrated circuit 136 of FIG. 1. The top plan view can include the line 1-1

The integrated circuit packaging system 100 can include the grid lead 102 exposed from the insulation layer 150. An array of a plurality of the grid lead 102 can be distributed across the surface of the insulation layer 150. The grid lead 102 can be located in the terminal area 126 of FIG. 1. The grid lead 102 can be located in the interior area 124 of FIG. 1.

The terminal redistribution layer 134 can connect the grid lead 102 in the terminal area 126 to another of the grid lead 102 in the terminal area 126. The terminal redistribution layer 134 can connect the grid lead 102 in the terminal area 126 to the plated land 142, another of the grid lead 102 in the interior area 124, the interior redistribution layer 135, or a combination thereof.

The interior redistribution layer 135 can connect the grid lead 102 in the interior area 124 to another of the grid lead 102 in the interior area 124. The interior redistribution layer 135 can connect the grid lead 102 in the interior area 124 to the plated land 142, another of the grid lead 102 in the terminal area, the terminal redistribution layer 134, or a combination thereof. The interior redistribution layer 135 can connect the plated land 142 to another of the plated land 142.

Figure 3:
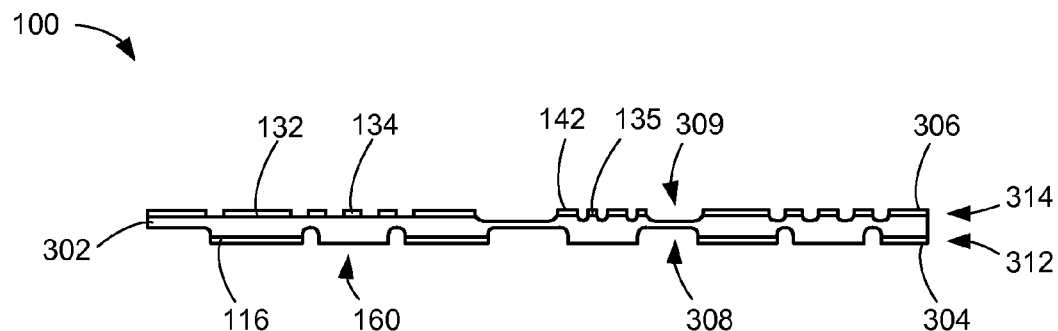
FIG. 3 is the structure of FIG. 1 in a forming phase of manufacture.

Referring now to FIG. 3, therein is shown the structure of FIG. 1 in a forming phase of manufacture. The forming phase can include a forming method to plate and etch the terminal redistribution layer 134, the interior redistribution layer 135, the support pad 160, the grid lead bottom pad 116, the grid lead top pad 132, and the plated land 142 on a leadframe 302 for the integrated circuit packaging system 100. The process depicted in FIG. 3 to FIG. 8 can represent the manufacturing steps for the integrated circuit packaging system 100.

The leadframe 302 is defined as a structure for mounting and connecting a semiconductor device thereto. The leadframe 302 can include a leadframe bottom side 304 and a leadframe top side 306 opposite the leadframe bottom side 304. The leadframe 302 can be formed of an electrically conductive material including copper (Cu), another metal, or a metal alloy The leadframe 302 can include the grid lead bottom pad 116 formed by plating the leadframe bottom side 304 with a bottom etch mask 312 and removing a portion of the leadframe 302 not protected by the bottom etch mask 312. The bottom etch mask 312 is a conductive trace material plated on the leadframe 302 to define the location of the gird lead bottom pad 116. The bottom etch mask 312 can be formed from conductive material such as a metal or a metal alloy.

The leadframe 302 can include the support pad 160 formed by applying a support pad mask (not shown) on the leadframe bottom side 304 and removing a portion of the leadframe 302 not protected by the support pad mask. The support pad mask can be a protective material applied at the leadframe 302 to define the location of the support pad 160. The support pad mask can be removed after forming the support pad 160. The support pad 160 can be positioned in a location having a space gap greater than 0.65 mm.

The horizontal diameter of the support pad 160 is smaller than the horizontal diameter of the grid lead 102 to allow for removal of the support pad 160. For example, the support pad 160 can have a horizontal diameter between 50-100 μm. In another example, the grid lead 102 can have a horizontal diameter of 350 μm or less.

A portion of the leadframe 302 from the leadframe bottom side 304 can be removed with an etching process to form a partially removed bottom portion 308. As an illustrative example, the leadframe 302 is shown as a structure pre-etched at the leadframe bottom side 304.

The leadframe 302 can include the terminal redistribution layer 134, the interior redistribution layer 135, the grid lead top pad 132, and the plated land 142 formed on the leadframe top side 306. The terminal redistribution layer 134, the interior redistribution layer 135, the grid lead top pad 132, and the plated land 142 can be formed by plating the leadframe top side 306 with a top etch mask 314 and removing a portion of the leadframe 302 not protected by the top etch mask 314.

The top etch mask 314 is a conductive trace material plated on the leadframe 302 to define the location of the terminal redistribution layer 134, the interior redistribution layer 135, the grid lead top pad 132, and the plated land 142. The top etch mask 314 can be formed from conductive material such as a metal or a metal alloy. A portion of the leadframe 302 can be removed to form a partially removed top portion 309.

The leadframe 302 can have a portion removed from the leadframe top side 306 in a variety of ways. For example, the leadframe 302 can be half etched, partially etched, ground, stamped, coined, pressed, or a combination thereof in the interior area 124 of FIG. 1 or the terminal area 126 of FIG. 1.

In another example, the partially removed top portion 309 can be formed by partially etching the portion of the leadframe 302 in the interior area 124 surrounding the interior redistribution layer 135, the plated land 142, and the grid lead top pad 132. In yet another example, if the interior area 124 has been half etched, the grid lead 102 can include an indentation on the half etched side facing the interior area 124.

Figure 4:
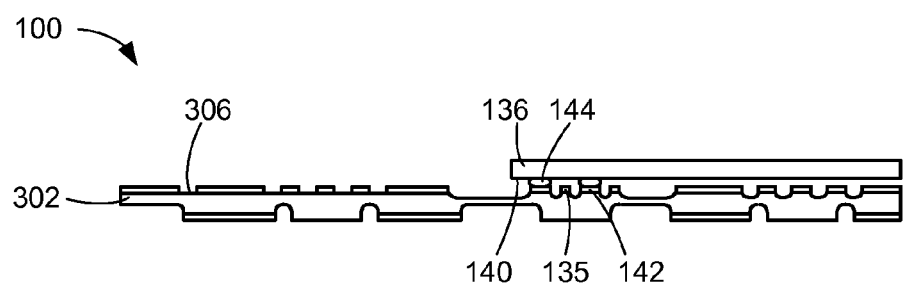
FIG. 4 is the structure of FIG. 3 in an attaching phase.

Referring now to FIG. 4, therein is shown the structure of FIG. 3 in an attaching phase. The attaching phase can include a die attach method to mount the integrated circuit 136 over the leadframe 302 for the integrated circuit packaging system 100.

The integrated circuit 136 can be mounted over the plated land 142, the land interconnect 144, and the interior redistribution layer 135. The land interconnect 144 is in direct contact with no intervening elements with the integrated circuit 136 and the plated land 142. The integrated circuit 136 can be mounted over the leadframe 302 with the active side 140 facing the leadframe top side 306.

Figure 5:
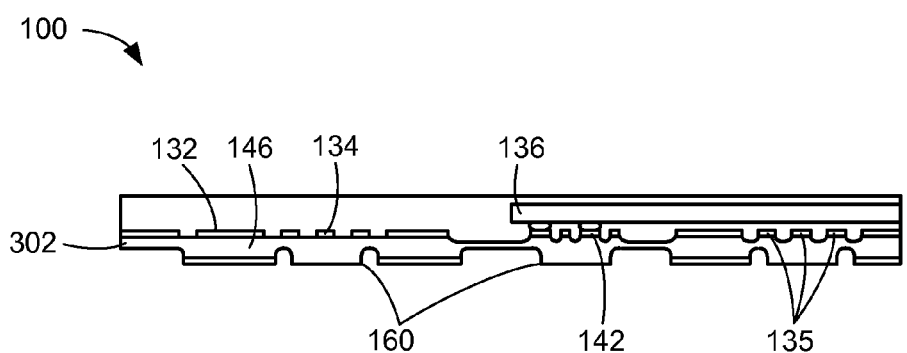
FIG. 5 is the structure of FIG. 4 in a molding phase.

Referring now to FIG. 5, therein is shown the structure of FIG. 4 in a molding phase. The molding phase can include a molding method to form the encapsulation 146 over the leadframe 302 for the integrated circuit packaging system 100.

The encapsulation 146 can be molded over and in directly contact with the leadframe 302, the terminal redistribution layer 134, the integrated circuit 136, the interior redistribution layer 135, the plated land 142, and the grid lead top pad 132. In an illustrative example, the encapsulation 146 can completely cover the integrated circuit 136.

The pressure of forming the encapsulation 146 can cause bowing of the leadframe 302. Bowing is defined as a deformation of the leadframe 302. The leadframe 302 can include the terminal redistribution layer 134 and the interior redistribution layer 135 that can be supported by the support pad 160. The support pad 160 can provide mechanical support to prevent bowing of the terminal redistribution layer 134 and the interior redistribution layer 135.

Figure 6:
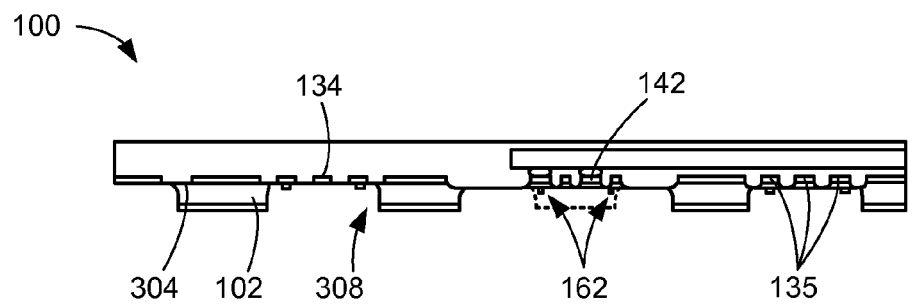
FIG. 6 is the structure of FIG. 5 in a removing phase.

Referring now to FIG. 6, therein is shown the structure of FIG. 5 in a removing phase. The removing phase can include a removal method for removing a portion of the leadframe 302 of FIG. 3 for the integrated circuit packaging system 100.

A portion of the leadframe 302 at the leadframe bottom side 304 can be removed in the partially removed bottom portion 308. Removal of the portion of the leadframe 302 in the partially removed bottom portion 308 can form the grid lead 102 and expose a bottom portion of the terminal redistribution layer 134, the interior redistribution layer 135, and the plated land 142. Removal of the partially removed bottom portion 308 can electrically separate the terminal redistribution layer 134, the interior redistribution layer 135, the plated land 142, and the grid lead 102.

The removing phase can include removing the support pad 160 of FIG. 1 used to prevent bowing during the manufacturing process. For example, the etching in the removal phase can remove the support pad 160 because the surface of the support pad 160 is unprotected.

Removing the support pad 160 can leave the support pad residue 162 extended downward from the bottom surfaces of the terminal redistribution layer 134, the interior redistribution layer 135, and the plated land 142. The interior redistribution layer 135 and the plated land 142 can include a portion of the conductive trace material and a portion of the leadframe material due to the half etching of the leadframe 302.

It is understood that during the removing phase, a portion of the leadframe 302 can be removed forming an indentation in the encapsulation 146 beneath the interior redistribution layer 135 and the plated land 142 where the leadframe 302 has been half etched. The encapsulation 146 can extend below the interior redistribution layer 135 and the plated land 142 in the interior area 124.

Figure 7:
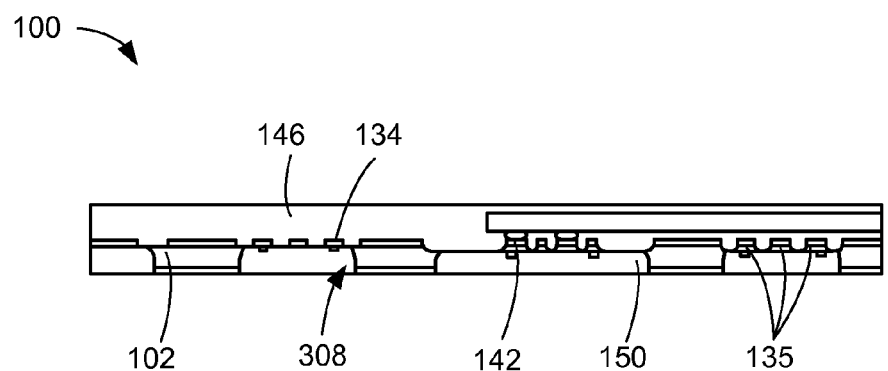
FIG. 7 is the structure of FIG. 6 in an applying phase.

Referring now to FIG. 7, therein is shown the structure of FIG. 6 in an applying phase. The applying phase can include an application method for applying the insulation layer 150 to the structure of FIG. 6 of the integrated circuit packaging system 100.

The insulation layer 150 can be applied directly on the partially removed bottom portion 308 including portions of the grid lead 102, the terminal redistribution layer 134, the interior redistribution layer 135, and the encapsulation 146. The insulation layer 150 can protect bottom surfaces of the terminal redistribution layer 134, the interior redistribution layer 135, and the plated land 142. The insulation layer 150 can electrically isolate the grid lead 102 and another of the grid lead 102.

Figure 8:
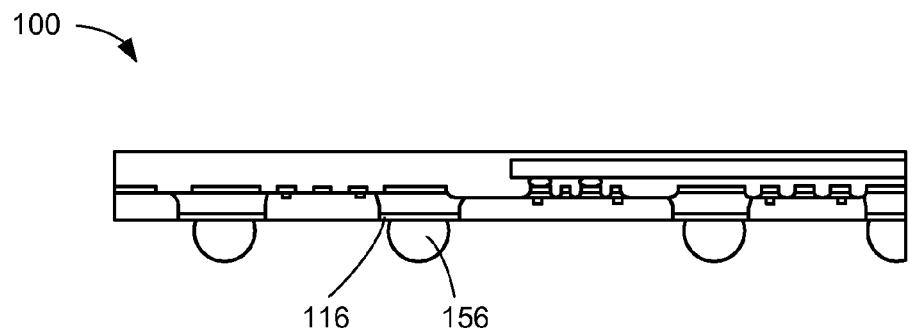
FIG. 8 is the structure of FIG. 7 in a connecting phase.

Referring now to FIG. 8, therein is shown the structure of FIG. 7 in a connecting phase. The connecting phase can include a connecting method for attaching the external connector 156 of the integrated circuit packaging system 100.

The connecting phase can include connecting the external connector 156 on the grid lead bottom pad 116. The external connector 156 can include a solder bump, metal bump, a solder ball, or a combination thereof.

Figure 9:
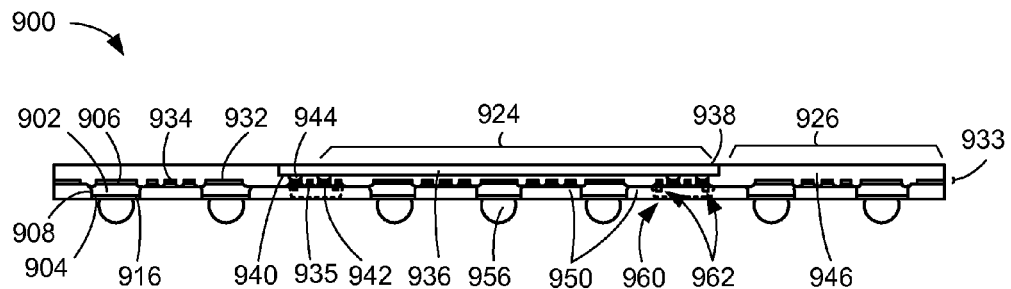
FIG. 9 is a cross-sectional view of an integrated circuit packaging system in a second embodiment of the present invention.

Referring now to FIG. 9, therein is shown a cross-sectional view of an integrated circuit packaging system 900 in a second embodiment of the present invention. The integrated circuit packaging system 900 can include a leadframe lead array.

The integrated circuit packaging system 900 can include a grid lead 902. The grid lead 902 is a structure that provides connectivity for electrical signals or electrical potential levels between the integrated circuit packaging system 900 and an external system (not shown). For example, the grid lead 902 can represent an interconnection including a terminal or a pad.

The grid lead 902 can include a grid lead bottom side 904 and a grid lead top side 906 opposite the grid lead bottom side 904. The grid lead 902 can include a grid lead non-horizontal side 908 extending between the grid lead bottom side 904 and the grid lead top side 906.

The grid lead 902 can include a grid lead bottom pad 916. The grid lead bottom pad 916 is an attachment site for providing electrical connection to the bottom of the grid lead 902. The grid lead bottom pad 916 can be formed at the grid lead bottom side 904

The grid lead 902 can include a grid lead top pad 932. The grid lead top pad 932 is an attachment site for providing electrical connection to the top of the grid lead 902. The grid lead top pad 932 can be formed at the grid lead top side 906. For example, the grid lead bottom pad 916 and the grid lead top pad 932 can be a plating formed from a metal or metal alloy.

The integrated circuit packaging system 900 can include a redistribution layer 933. The redistribution layer 933 can include a terminal redistribution layer 934, which is defined as a structure that provides electrical connectivity between the grid lead 902 and a semiconductor device. The terminal redistribution layer 934 can route electrical connections or redistributes electrical signals from an integrated circuit 936 to the grid lead 902.

The integrated circuit 936 is defined as a semiconductor device. The integrated circuit 936 can include an inactive side 938 and an active side 940 opposite the inactive side 938. The terminal redistribution layer 934 can be routed between the grid lead 902 and another of the grid lead 902. For example, the integrated circuit 936 can include a flipchip, a wire-bond chip, a silicon (Si) die, or other microelectronic device.

The integrated circuit packaging system 900 can include a plated land 942. The plated land 942 is defined as an electrically conductive structure for mounting the integrated circuit 936. The plated land 942 can provide electrical connectivity between the integrated circuit 936 and an external system.

The plated land 942 can be connected to the integrated circuit 936 with a land interconnect 944. The land interconnect 944 can be a structure for providing electrical connectivity between the integrated circuit 936 and the plated land 942. For example, the land interconnect 944 can be a solder ball, metal bump, bond wire, lead, solder bump, or a combination thereof. In an illustrative example, the integrated circuit 936 can include the land interconnect 944.

The integrated circuit packaging system 900 can include an interior area 924 and a terminal area 926. The interior area 924 is the portion of the integrated circuit packaging system 900 under a periphery of the integrated circuit 936. The interior area 924 can be the portion of the integrated circuit packaging system 900 surrounded by a periphery of a plurality of the plated land 942.

The terminal area 926 can be the portion of the integrated circuit packaging system 900 outside the interior area 924. The terminal redistribution layer 934 can be formed in the terminal area 926. The interior area 924 and the terminal area 926 can be half etched.

The integrated circuit packaging system 900 can include the redistribution layer 933. The redistribution layer 933 can include an interior redistribution layer 935 formed in the interior area 924. The interior redistribution layer 935 is a structure that provides electrical connectivity for distributing electrical signals from the semiconductor device in the interior area 924.

The interior redistribution layer 935 can provide electrical connectivity between the integrated circuit 936, the plated land 942, another of the plated land 942, the grid lead 902, and the terminal redistribution layer 934. The terminal redistribution layer 934 and the interior redistribution layer 935 can be formed from the same structure, process, and material as the redistribution layer 933.

The interior redistribution layer 935 can be formed between the plated land 942 and another of the plated land 942. The terminal redistribution layer 934 can form electrical connections with the interior redistribution layer 935.

The integrated circuit 936 can include the active side 940 facing the plated land 942. The integrated circuit 936 can be mounted over the plated land 942 with the land interconnect 944 in direct contact with no intervening elements with the integrated circuit 936 and the plated land 942.

The integrated circuit packaging system 900 can include an encapsulation 946. The encapsulation 946 is defined as a package cover providing protection hermetic seal. The encapsulation 946 can be formed on the grid lead 902, the grid lead top pad 932, the terminal redistribution layer 934, the interior redistribution layer 935, and the land interconnect 944. The encapsulation 946 can cover the non-horizontal side surfaces of the integrated circuit 936 and expose the inactive side 938 of the integrated circuit 936.

The encapsulation 946 can be formed in a variety of ways. For example, the encapsulation 946 can be formed using transfer molding, injection molding, vacuum molding, film assist molding, or a combination thereof. The encapsulation 946 can include materials such as a capillary underfill, a non-conductive paste (NCP), a molded underfill (MUF), or a combination thereof.

The formation of the encapsulation 946 can cause the integrated circuit packaging system 900 to bow or deform. The deformation or bowing can be reduced by forming a support pad 960 on the bottom side of the integrated circuit packaging system 900 for providing mechanical support during the formation of the encapsulation 946.

The support pad 960 can be directly under areas susceptible to deformation including the terminal redistribution layer 934, the interior redistribution layer 935, and the plated land 942. The location of the support pad 960 is indicated by the dashed lines below the terminal redistribution layer 934, the interior redistribution layer 935 and the plated land 942.

The support pad 960 can be removed in a later stage of manufacture, but upon close examination, the support pad 960 can leave a support pad residue 962 on the bottom surfaces of the terminal redistribution layer 934, the interior redistribution layer 935, and the plated land 942. The support pad residue 962 is defined as an irregular residual material from the support pad 960 and on the structures previously supported by the support pad 960 as a result of removing the support pad 960. The support pad residue 962 is exposed from planted land 942 and the redistribution layer 933 including the terminal redistribution layer 934 and the interior redistribution layer 935.

The support pad residue 962 can form irregular bottom surfaces of the terminal redistribution layer 934, the interior redistribution layer 935, and the plated land 942 characteristic of the removal of material. For example, the support pad residue 962 can include etch marks, partial outlines of the support pad 960, grooves, metal protrusions, or a combination thereof.

The integrated circuit packaging system 900 can include an insulation layer 950 for electrically protecting portions of the bottom surfaces of the terminal redistribution layer 934 and the interior redistribution layer 935. The insulation layer 950 can include an insulation material including a passivation, a solder resist, an epoxy, or an adhesive.

The insulation layer 950 can be formed between the grid lead 902 and another of the grid lead 902. The insulation layer 950 can be formed on portions of the grid lead 902, the terminal redistribution layer 934, the interior redistribution layer 935, and the encapsulation 946. The insulation layer 950 can electrically isolate the terminal redistribution layer 934, the grid lead 902, and the interior redistribution layer 935.

The integrated circuit packaging system 900 can include an external connector 956, which is an electrically conductive structure for connecting the grid lead bottom pad 916 and the external system. For example, the external connector 956 can be formed with a conductive material including solder, a metal, or a metallic alloy.

It has been discovered that the present invention provides wire span reduction, package size reduction, cost savings, and elimination of complex bond layout by connecting the terminal redistribution layer 934 with the interior redistribution layer 935, the grid lead 902, and the integrated circuit 936.

It has been discovered that the present invention provides increased routing area and routing functionality by having the interior redistribution layer 935 under the integrated circuit 936. The interior redistribution layer 935 can be used for routing electrical signals between the grid lead 902, the plated land 942, the terminal redistribution layer 934, and the integrated circuit 936.

It has been discovered that the present invention provides increased reliability by having the support pad 960 positioned to reduce bowing during the molding of the encapsulation 946. The regions around the terminal redistribution layer 934, the interior redistribution layer 935, and the plated land 942 can bow down to the level of the grid lead bottom pad 916 without support. The support pad 960 provides mechanical support during molding to reduce the bowing of the terminal redistribution layer 934, the interior redistribution layer 935, and the plated land 942 by up to 100 percent of the height of the support pad 960.

Figure 10:
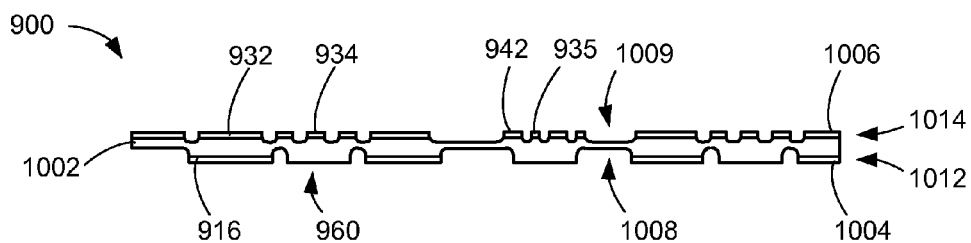
FIG. 10 is the structure of FIG. 9 in a forming phase of manufacture.

Referring now to FIG. 10, therein is shown the structure of FIG. 9 in a forming phase of manufacture. The forming phase can include a forming method for plating and etching the terminal redistribution layer 935, the interior redistribution layer 935, the support pad 960, the grid lead bottom pad 916, the grid lead top pad 932, and the plated land 942 on a leadframe 1002 of the integrated circuit packaging system 900. The process depicted in FIG. 9 to FIG. 15 can represent the manufacturing steps for the integrated circuit packaging system 900.

The leadframe 1002 is defined as a structure for mounting and connecting a semiconductor device thereto. The leadframe 1002 can include a leadframe bottom side 1004 and a leadframe top side 1006 opposite the leadframe bottom side 1004. The leadframe 1002 can be formed of an electrically conductive material including copper (Cu), another metal, or a metal alloy.

The leadframe 1002 can include the grid lead bottom pad 916 formed by plating the leadframe bottom side 1004 with a bottom etch mask 1012 and removing a portion of the leadframe 1002 not protected by the bottom etch mask 1012. The bottom etch mask 1012 is a conductive trace material plated on the leadframe 1002 to define the location of the gird lead bottom pad 916. The bottom etch mask 1012 can be formed from conductive material such as a metal or a metal alloy.

The leadframe 1002 can include the support pad 960 formed by applying a support pad mask (not shown) on the leadframe bottom side 1004 and removing a portion of the leadframe 1002 not protected by the support pad mask. The support pad mask can be a protective material applied at the leadframe 1002 to define the location of the support pad 960. The support pad mask can be removed after forming the support pad 960. The support pad 960 can be positioned in a location having a space gap greater than 0.65 mm.

The horizontal diameter of the support pad 960 is smaller than the horizontal diameter of the grid lead 902 to allow for removal of the support pad 960. For example, the support pad 960 can have a horizontal diameter between 50-100 µm. In another example, the grid lead 902 can have a horizontal diameter of 350 µm or less.

A portion of the leadframe 1002 at the leadframe bottom side 1004 can be removed with an etching process to form a partially removed bottom portion 1008. As an illustrative example, the leadframe 1002 is shown as a structure pre-etched at the leadframe bottom side 1004.

The leadframe 1002 can include the terminal redistribution layer 934, the interior redistribution layer 935, the grid lead top pad 932, and the plated land 942 formed on the leadframe top side 1006. The terminal redistribution layer 934, the interior redistribution layer 935, the grid lead top pad 932, and the plated land 942 can be formed by plating the leadframe top side 1006 with a top etch mask 1014 and removing a portion of the leadframe 1002 not protected by the top etch mask 1014.

The top etch mask 1014 is a conductive trace material plated on the leadframe 1002 to define the location of the terminal redistribution layer 934, the interior redistribution layer 935, the grid lead top pad 932, and the plated land 942. The top etch mask 1014 can be formed from conductive material such as a metal or a metal alloy. A portion of the leadframe 1002 can be removed to form a partially removed top portion 1009.

The leadframe 1002 can have a portion removed on the leadframe top side 1006 in a variety of ways. For example, the leadframe 1002 can be half etched, partially etched, ground, stamped, coined, pressed, or a combination thereof in the interior area 924 of FIG. 9 or the terminal area 926 of FIG. 9.

In another example, the partially removed top portion 1009 can be formed by partially etching the portion of the leadframe 1002 in the interior area 924 and the terminal area 926 surrounding the terminal redistribution layer 934, the interior redistribution layer 935, the plated land 942, and the grid lead top pad 932. In yet another example, if the interior area 924 has been half etched, the grid lead 902 can include an indentation on the half etched side facing the interior area 924.

Figure 11:
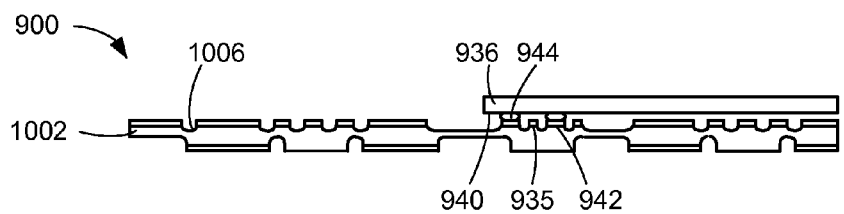
FIG. 11 is the structure of FIG. 10 in an attaching phase.

Referring now to FIG. 11, therein is shown the structure of FIG. 10 in an attaching phase. The attaching phase can include a die attach method for mounting the integrated circuit 936 over the leadframe 1002 of the integrated circuit packaging system 900.

The integrated circuit 936 can be mounted over the plated land 942, the land interconnect 944, and the interior redistribution layer 935. The land interconnect 944 is in direct contact with no intervening elements with the integrated circuit 936 and the plated land 942. The integrated circuit 936 can be mounted over the leadframe 1002 with the active side 940 facing the leadframe top side 1006.

Figure 12:
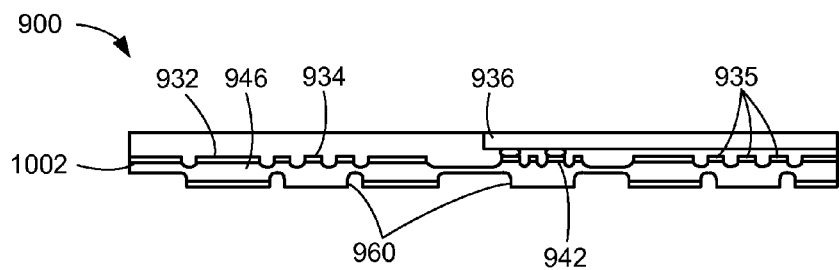
FIG. 12 is the structure of FIG. 11 in a molding phase.

Referring now to FIG. 12, therein is shown the structure of FIG. 11 in a molding phase. The molding method can include forming the encapsulation 946 over the leadframe 1002 of the integrated circuit packaging system 900.

The encapsulation 946 can be molded over and in directly contact with the leadframe 1002, the terminal redistribution layer 934, the integrated circuit 936, the interior redistribution layer 935, the plated land 942, and the grid lead top pad 932. In an illustrative example, the encapsulation 946 can completely cover the integrated circuit 936.

The pressure of forming the encapsulation 946 can cause bowing of the leadframe 1002. Bowing is defined as a deformation of the leadframe 1002. The leadframe 1002 can include the terminal redistribution layer 934 and the interior redistribution layer 935 that can be supported by the support pad 960. The support pad 960 can provide mechanical support to prevent bowing of the terminal redistribution layer 934 and the interior redistribution layer 935.

Figure 13:
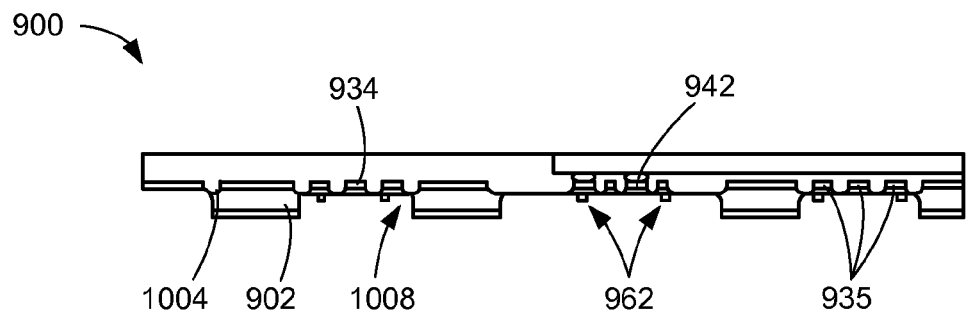
FIG. 13 is the structure of FIG. 12 in a removing phase.

Referring now to FIG. 13, therein is shown the structure of FIG. 12 in a removing phase. The removal phase can include a removal method for removing a portion of the leadframe 1002 of FIG. 10 of the integrated circuit packaging system 900.

A portion of the leadframe 1002 at the leadframe bottom side 1004 can be removed in the partially removed bottom portion 1008. Removal of the portion of the leadframe 1002 in the partially removed bottom portion 1008 can form the grid lead 902 and expose a bottom portion of the terminal redistribution layer 934, the interior redistribution layer 935, and the plated land 942. Removal of the partially removed bottom portion 1008 can electrically separate the terminal redistribution layer 934, the interior redistribution layer 935, the plated land 942, and the grid lead 902.

The removing phase can include removing the support pad 960 of FIG. 9 used to prevent bowing during the manufacturing process. For example, the etching in the removal phase can remove the support pad 960 because the surface of the support pad 960 is unprotected.

Removing the support pad 960 can leave the support pad residue 962 extended downward from the bottom surfaces of the terminal redistribution layer 934, the interior redistribution layer 935, and the plated land 942. The terminal redistribution layer 934, the interior redistribution layer 935, and the plated land 942 can include a portion of the conductive trace material and a portion of the leadframe material due to the half etching of the leadframe 1002.

It is understood that during the removing phase, a portion of the leadframe 1002 can be removed forming an indentation in the encapsulation 946 beneath the terminal redistribution layer 934, the interior redistribution layer 935 and the plated land 942 where the leadframe 1002 has been half etched. The encapsulation 946 can extend below the terminal redistribution layer 934, the interior redistribution layer 935 and the plated land 942 in the interior area 924.

Figure 14:
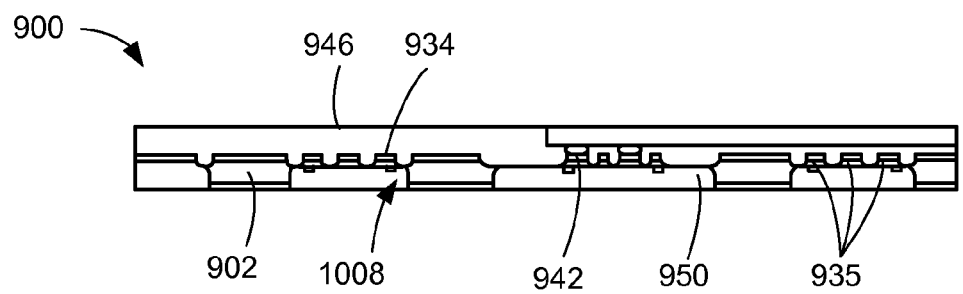
FIG. 14 is the structure of FIG. 13 in an applying phase.

Referring now to FIG. 14, therein is shown the structure of FIG. 13 in an applying phase. The applying phase can include an application method for applying the insulation layer 950 to the structure of FIG. 13 of the integrated circuit packaging system 900.

The insulation layer 950 can be applied directly on the partially removed bottom portion 1008 including portions of the grid lead 902, the terminal redistribution layer 934, the interior redistribution layer 935, and the encapsulation 946. The insulation layer 950 can protect bottom surfaces of the terminal redistribution layer 934, the interior redistribution layer 935, and the plated land 942. The insulation layer 950 can electrically isolate the grid lead 902 and another of the grid lead 902.

Figure 15:
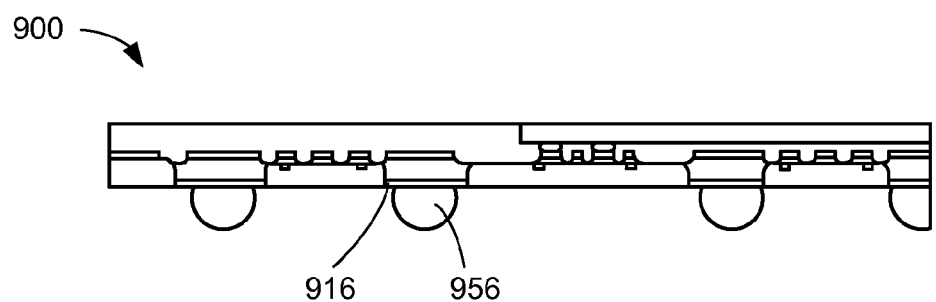
FIG. 15 is the structure of FIG. 14 in a connecting phase.

Referring now to FIG. 15, therein is shown the structure of FIG. 14 in a connecting phase. The connecting phase can include a connecting method for attaching the external connector 956 of the integrated circuit packaging system 900.

The connecting phase can include connecting the external connector 956 on the grid lead bottom pad 916. The external connector 956 can include a solder bump, a metal bump, a solder ball, or a combination thereof.

Figure 16:
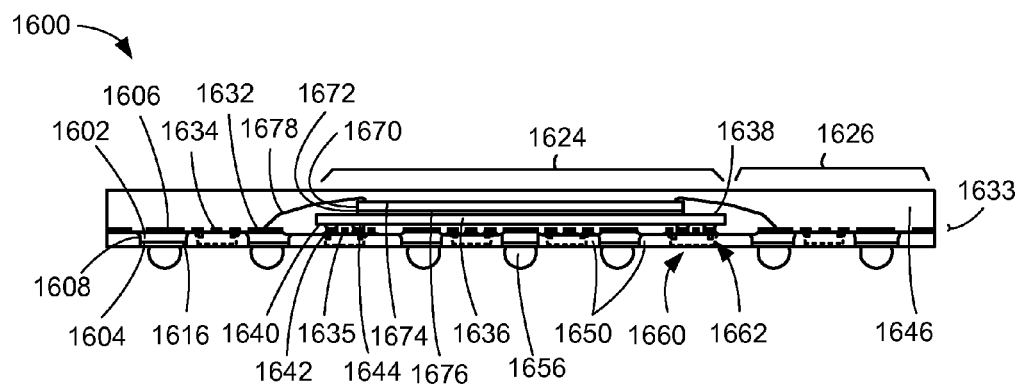
FIG. 16 is a cross-sectional view of an integrated circuit packaging system along line 16-16 of FIG. 17 in a third embodiment of the present invention.
Figure 17:
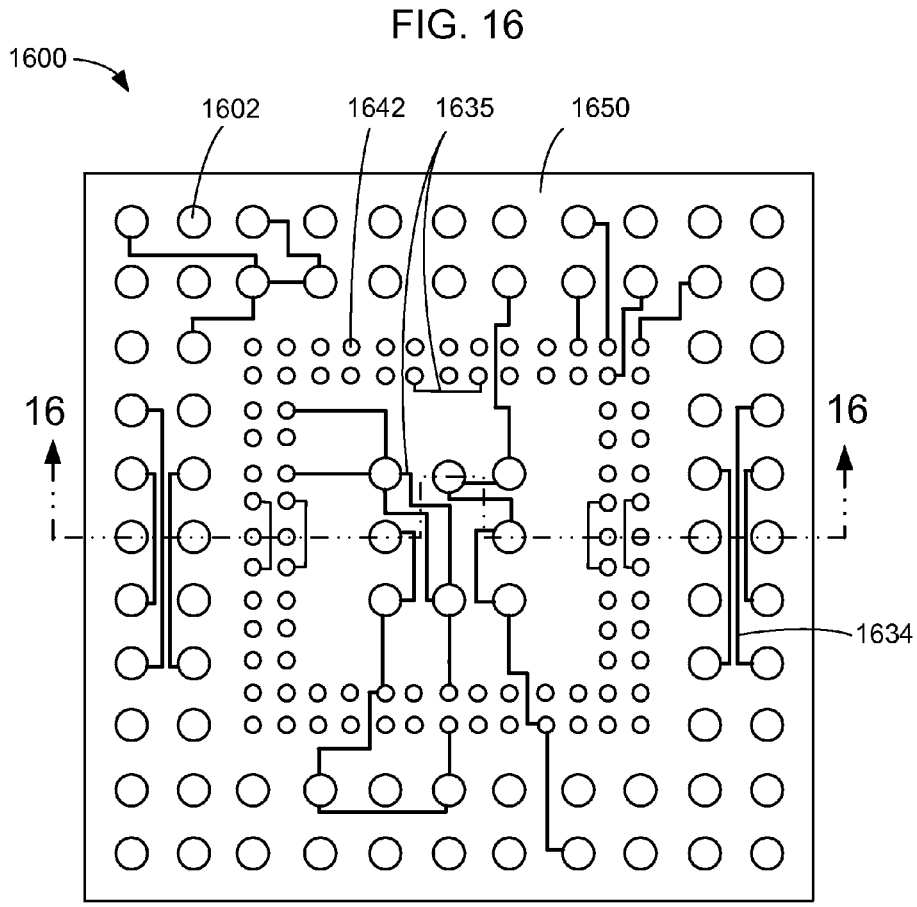
FIG. 17 is an exemplary top plan view of the integrated circuit packaging system of FIG. 16.

Referring now to FIG. 16, therein is shown a cross-sectional view of an integrated circuit packaging system 1600 along line 16-16 of FIG. 17 in a third embodiment of the present invention. The integrated circuit packaging system 1600 can include a leadframe lead array.

The integrated circuit packaging system 1600 can include a grid lead 1602. The grid lead 1602 is a structure that provides connectivity for electrical signals or electrical potential levels between the integrated circuit packaging system 1600 and an external system (not shown). For example, the grid lead 1602 can represent an interconnection including a terminal or a pad.

The grid lead 1602 can include a grid lead bottom side 1604 and a grid lead top side 1606 opposite the grid lead bottom side 1604. The grid lead 1602 can include a grid lead non-horizontal side 1608 extending between the grid lead bottom side 1604 and the grid lead top side 1606.

The grid lead 1602 can include a grid lead bottom pad 1616. The grid lead bottom pad 1616 is an attachment site for providing electrical connectivity to the bottom of the grid lead 1602. The grid lead bottom pad 1616 can be formed at the grid lead bottom side 1604.

The grid lead 1602 can include a grid lead top pad 1632. The grid lead top pad 1632 is an attachment site for providing electrical connectivity to the top of the grid lead 1602. The grid lead top pad 1632 can be formed at the grid lead top side 1606. For example, the grid lead bottom pad 1616 and the grid lead top pad 1632 can be a plating formed from a metal or metal alloy.

The integrated circuit packaging system 1600 can include a redistribution layer 1633. The redistribution layer 1633 can include a terminal redistribution layer 1634. The terminal redistribution layer 1634 is a structure that provides electrical connectivity between the grid lead 1602 and a semiconductor device. The terminal redistribution layer 1634 can route electrical connections or redistributes electrical signals from an integrated circuit 1636 to the grid lead 1602.

The integrated circuit 1636 is defined as a semiconductor device. The integrated circuit 1636 can include an inactive side 1638 and an active side 1640 opposite the inactive side 1638. The terminal redistribution layer 1634 can be routed between the grid lead 1602 and another of the grid lead 1602. For example, the integrated circuit 1636 can include a flip-chip, a wire-bond chip, a silicon (Si) die, or other microelectronic device.

The integrated circuit packaging system 1600 can include a top die 1670. The top die 1670 is defined as a semiconductor device. For example, the top die 1670 can include a flipchip, a wire-bond chip, a silicon (Si) die, or other microelectronic device.

The top die 1670 can be mounted over the integrated circuit 1636 with a die adhesive layer 1672. The top die 1670 can include a top die active side 1674 and a top die inactive side 1676. The top die 1670 is mounted over the integrated circuit 1636 with the top die inactive side 1676 facing the integrated circuit 1636.

The top die 1670 can be connected to the grid lead 1602 with a die interconnect 1678. The die interconnect 1678 is defined as a structure providing electrical connectivity between the top die 1670 and the terminal redistribution layer 1634. For example, the die interconnect 1678 can be a bond wire, a conductive trace, a lead, or a combination thereof.

The integrated circuit packaging system 1600 can include a plated land 1642. The plated land 1642 is defined as an electrically conductive structure for mounting the integrated circuit 1636. The plated land 1642 can provide electrical connectivity between the integrated circuit 1636 and an external system.

The plated land 1642 can be connected to the integrated circuit 1636 with a land interconnect 1644. The land interconnect 1644 can be a structure for providing electrical connectivity between the integrated circuit 1636 and the plated land 1642. For example, the land interconnect 1644 can be a solder ball, metal bump, bond wire, lead, solder bump, or a combination thereof. In an illustrative example, the integrated circuit 1636 can include the land interconnect 1644.

The integrated circuit packaging system 1600 can include an interior area 1624 and a terminal area 1626. The interior area 1624 can be the portion of the integrated circuit packaging system 1600 under a periphery of the integrated circuit 1636. The interior area 1624 can be the portion of the integrated circuit packaging system 1600 surrounded by a periphery of a plurality of the plated land 1642.

The terminal area 1626 can be the portion of the integrated circuit packaging system 1600 outside the interior area 1624. The terminal redistribution layer 1634 can be formed in the terminal area 1626.

The integrated circuit packaging system 1600 can include the redistribution layer 1633. The redistribution layer 1633 can include an interior redistribution layer 1635 formed in the interior area 1624. The interior redistribution layer 1635 is a structure that provides electrical connectivity for distributing electrical signals from the semiconductor device in the interior area 1624.

The interior redistribution layer 1635 can provide electrical connectivity between the integrated circuit 1636, the plated land 1642, another of the plated land 1642, the grid lead 1602, and the terminal redistribution layer 1634. The terminal redistribution layer 1634 and the interior redistribution layer 1635 can be formed from the same structure, process, and material as the redistribution layer 1633.

The interior redistribution layer 1635 can be formed between the plated land 1642 and another of the plated land 1642. The terminal redistribution layer 1634 can form electrical connections with the interior redistribution layer 1635.

The integrated circuit 1636 can include the active side 1640 facing the plated land 1642. The integrated circuit 1636 can be mounted over the plated land 1642 with the land interconnect 1644 in direct contact with no intervening elements with the integrated circuit 1636 and the plated land 1642.

The integrated circuit packaging system 1600 can include an encapsulation 1646. The encapsulation 1646 is defined as a package cover providing protection hermetic seal.

The encapsulation 1646 can be formed in a variety of ways. For example, the encapsulation 1646 can be formed using transfer molding, injection molding, vacuum molding, film assist molding, or a combination thereof. The encapsulation 1646 can include materials such as a capillary underfill, a non-conductive paste (NCP), a molded underfill (MUF), or a combination thereof.

The encapsulation 1646 can be formed on and over the integrated circuit 1636, the grid lead 1602, the top die 1670, the die interconnect 1678, the terminal redistribution layer 1634, the interior redistribution layer 1635, the land interconnect 1644. The encapsulation 1646 can cover the top die active side 1674.

The formation of the encapsulation 1646 can cause the integrated circuit packaging system 1600 to bow or deform. The deformation or bowing can be reduced by forming a support pad 1660 on the bottom side of the integrated circuit packaging system 1600 for providing mechanical support during the formation of the encapsulation 1646.

The support pad 1660 can be directly under areas susceptible to deformation including the terminal redistribution layer 1634, the interior redistribution layer 1635, and the plated land 1642. The location of the support pad 1660 is indicated by the dashed lines below the terminal redistribution layer 1634, the interior redistribution layer 1635 and the plated land 1642.

The support pad 1660 can be removed in a later stage of manufacture, but upon close examination, the support pad 1660 can leave a support pad residue 1662 on the bottom surfaces of the terminal redistribution layer 1634, the interior redistribution layer 1635, and the plated land 1642. The support pad residue 1662 is defined as an irregular residual material from the support pad 1660 and on the structures previously supported by the support pad 1660 as a result of removing the support pad 1660. The support pad residue 1662 is exposed from planted land 1642 and the redistribution layer 1633 including the terminal redistribution layer 1634 and the interior redistribution layer 1635.

The support pad residue 1662 can form irregular bottom surfaces of the terminal redistribution layer 1634, the interior redistribution layer 1635, and the plated land 1642 characteristic of the removal of material. For example, the support pad residue 1662 can include etch marks, partial outlines of the support pad 1660, grooves, metal protrusions, or a combination thereof.

The integrated circuit packaging system 1600 can include an insulation layer 1650 for electrically protecting portions of the bottom surfaces of the terminal redistribution layer 1634 and the interior redistribution layer 1635. The insulation layer 1650 can include an insulation material including a passivation, a solder resist, an epoxy, or an adhesive.

The insulation layer 1650 can be formed between the grid lead 1602 and another of the grid lead 1602. The insulation layer 1650 can be formed on portions of the grid lead 1602, the terminal redistribution layer 1634, the interior redistribution layer 1635, and the encapsulation 1646. The insulation layer 1650 can electrically isolate the terminal redistribution layer 1634, the grid lead 1602, and the interior redistribution layer 1635.

The integrated circuit packaging system 1600 can include an external connector 1656, which is an electrically conductive structure for connecting the grid lead bottom pad 1616 and the external system. For example, the external connector 1656 can be formed with a conductive material including solder, a metal, or a metallic alloy.

It has been discovered that the present invention provides wire span reduction, package size reduction, cost savings, and elimination of complex bond layout by connecting the terminal redistribution layer 1634 with the interior redistribution layer 1635, the grid lead 1602, and the integrated circuit 1636.

It has been discovered that the present invention provides increased routing area and routing functionality by having the interior redistribution layer 1635 under the integrated circuit 1636. The interior redistribution layer 1635 can be used for routing electrical signals between the grid lead 1602, the plated land 1642, the terminal redistribution layer 1634, and the integrated circuit 1636.

It has been discovered that the present invention provides increased reliability by having the support pad 1660 positioned to reduce bowing during the molding of the encapsulation 1646. The regions around the terminal redistribution layer 1634, the interior redistribution layer 1635, and the plated land 1642 can bow down to the level of the grid lead bottom pad 1616 without support. The support pad 1660 provides mechanical support during molding to reduce the bowing of the terminal redistribution layer 1634, the interior redistribution layer 1635, and the plated land 1642 by up to 100 percent of the height of the support pad 1660.

Referring now to FIG. 17, therein is shown an exemplary top plan view of the integrated circuit packaging system 1600 of FIG. 16. The top plan view does not show the encapsulation 1646 of FIG. 16 or the integrated circuit 1636 of FIG. 16. The top plan view can include the line 16-16.

The integrated circuit packaging system 1600 can include the grid lead 1602 exposed from the insulation layer 1650. An array of a plurality of the grid lead 1602 can be distributed across the surface of the insulation layer 1650. The grid lead 1602 can be located in the terminal area 1626 of FIG. 16. The grid lead 1602 can be located in the interior area 1624 of FIG. 16.

The terminal redistribution layer 1634 can connect the grid lead 1602 in the terminal area 1626 to another of the grid lead 1602 in the terminal area 1626. The terminal redistribution layer 1634 can connect the grid lead 1602 in the terminal area 1626 to the plated land 1642, another of the grid lead 1602 in the interior area 1624, the interior redistribution layer 1635, or a combination thereof.

The interior redistribution layer 1635 can connect the grid lead 1602 in the interior area 1624 to another of the grid lead 1602 in the interior area 1624. The interior redistribution layer 1635 can connect the grid lead 1602 in the interior area 1624 to the plated land 1642, another of the grid lead 1602 in the terminal area, the terminal redistribution layer 1634, or a combination thereof. The interior redistribution layer 1635 can connect the plated land 1642 to another of the plated land 1642.

Figure 18:
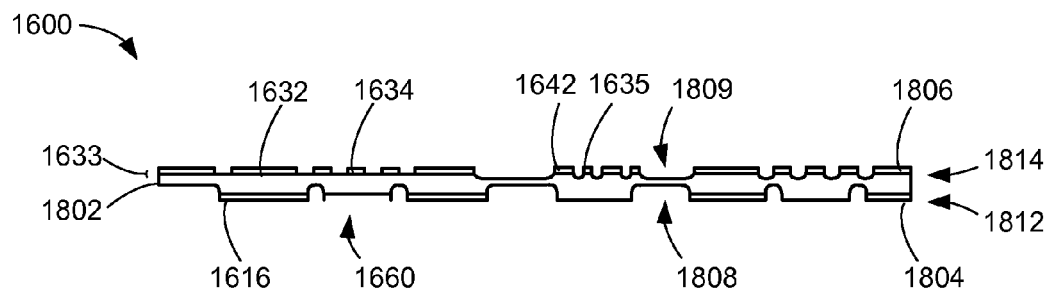
FIG. 18 is the structure of FIG. 16 in a forming phase of manufacture.

Referring now to FIG. 18, therein is shown the structure of FIG. 16 in a forming phase of manufacture. The forming phase can include a forming method for plating and etching the terminal redistribution layer 1634, the interior redistribution layer 1635, the support pad 1660, the grid lead bottom pad 1616, the grid lead top pad 1632, and the plated land 1642 on a leadframe 1802 of the integrated circuit packaging system 1600. The process depicted in FIG. 18 to FIG. 24 can represent the manufacturing steps for the integrated circuit packaging system 1600.

The leadframe 1802 is defined as a structure for mounting and connecting a semiconductor device thereto. The leadframe 1802 can include a leadframe bottom side 1804 and a leadframe top side 1806 opposite the leadframe bottom side 1804. The leadframe 1802 can be formed of an electrically conductive material including copper (Cu), another metal, or a metal alloy The leadframe 1802 can include the grid lead bottom pad 1616 formed by plating the leadframe bottom side 1804 with a bottom etch mask 1812 and removing a portion of the leadframe 1802 not protected by the bottom etch mask 1812. The bottom etch mask 1812 is a conductive trace material plated on the leadframe 1802 to define the location of the gird lead bottom pad 1616. The bottom etch mask 1812 can be formed from conductive material such as a metal or a metal alloy.

The leadframe 1802 can include the support pad 1660 formed by applying a support pad mask (not shown) on the leadframe bottom side 1804 and removing a portion of the leadframe 1802 not protected by the support pad mask. The support pad mask can be a protective material applied at the leadframe 1802 to define the location of the support pad 1660. The support pad mask can be removed after forming the support pad 1660. The support pad 1660 can be positioned in a location having a space gap greater than 0.65 mm.

The horizontal diameter of the support pad 1660 is smaller than the horizontal diameter of the grid lead 1602 to allow for removal of the support pad 1660. For example, the support pad 1660 can have a horizontal diameter between 50-100 μm. In another example, the grid lead 1602 can have a horizontal diameter of 350 μm or less.

A portion of the leadframe 1802 at the leadframe bottom side 1804 can be removed with an etching process to form a partially removed bottom portion 1808. As an illustrative example, the leadframe 1802 is shown as a structure pre-etched at the leadframe bottom side 1804.

The leadframe 1802 can include the terminal redistribution layer 1634, the interior redistribution layer 1635, the grid lead top pad 1632, and the plated land 1642 formed on the leadframe top side 1806. The terminal redistribution layer 1634, the interior redistribution layer 1635, the grid lead top pad 1632, and the plated land 1642 can be formed by plating the leadframe top side 1806 with a top etch mask 1814 and removing a portion of the leadframe 1802 not protected by the top etch mask 1814.

The top etch mask 1814 is a conductive trace material plated on the leadframe 1802 to define the location of the terminal redistribution layer 1634, the interior redistribution layer 1635, the grid lead top pad 1632, and the plated land 1642. The top etch mask 1814 can be formed from conductive material such as a metal or a metal alloy. A portion of the leadframe 1802 can be removed to form a partially removed top portion 1809.

The leadframe 1802 can have a portion removed on the leadframe top side 1806 in a variety of ways. For example, the leadframe 1802 can be half etched, partially etched, ground, stamped, coined, pressed, or a combination thereof in the interior area 1624 of FIG. 16 or the terminal area 1626 of FIG. 16.

In another example, the partially removed top portion 1809 can be formed by partially etching the portion of the leadframe 1802 in the interior area 1624 surrounding the interior redistribution layer 1635, the plated land 1642, and the grid lead top pad 1632. In yet another example, if the interior area 1624 has been half etched, the grid lead 1602 can include an indentation on the half etched side facing the interior area 1624.

Figure 19:
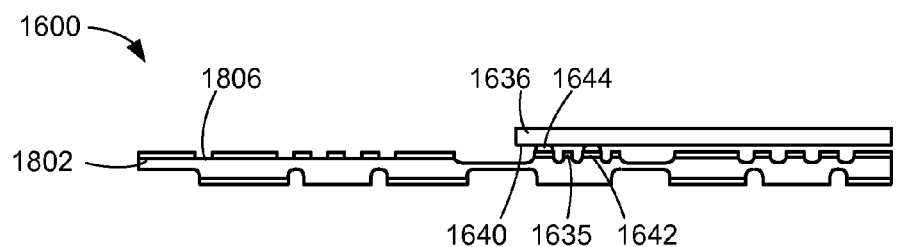
FIG. 19 is the structure of FIG. 18 in an attaching phase.

Referring now to FIG. 19, therein is shown the structure of FIG. 18 in an attaching phase. The attaching phase can include a die attach method for mounting the integrated circuit 1636 over the leadframe 1802 of the integrated circuit packaging system 1600.

The integrated circuit 1636 can be mounted over the plated land 1642, the land interconnect 1644, and the interior redistribution layer 1635. The land interconnect 1644 is in direct contact with no intervening elements with the integrated circuit 1636 and the plated land 1642. The integrated circuit 1636 can be mounted over the leadframe 1802 with the active side 1640 facing the leadframe top side 1806.

Figure 20:
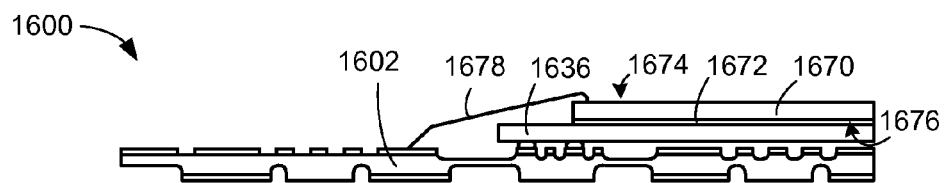
FIG. 20 is the structure of FIG. 19 in a mounting phase.

Referring now to FIG. 20, therein is shown the structure of FIG. 19 in a mounting phase. The mounting phase can include a top die mounting method for mounting the top die 1670 over the integrated circuit 1636 of the integrated circuit packaging system 1600.

The top die 1670 can be mounted over the integrated circuit 1636 with the die adhesive layer 1672. The top die inactive side 1676 can be facing the integrated circuit 1636. For example, the top die 1670 can include a wire bond die. The die interconnect 1678 can be electrically connected from the top die active side 1674 to the grid lead 1602.

Figure 21:
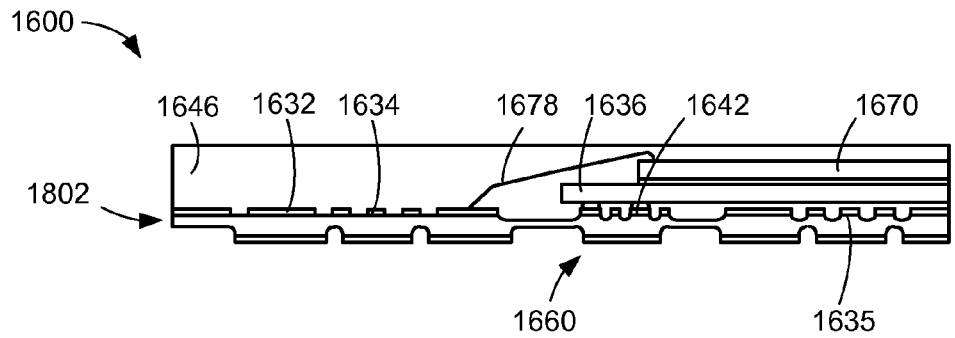
FIG. 21 is the structure of FIG. 20 in a molding phase.

Referring now to FIG. 21, therein is shown the structure of FIG. 20 in a molding phase. The molding phase can include a molding method for forming the encapsulation 1646 over the leadframe 1802 of the integrated circuit packaging system 1600.

The encapsulation 1646 can be molded over and in directly contact with the leadframe 1802, the terminal redistribution layer 1634, the integrated circuit 1636, the top die 1670, the die interconnect 1678, the interior redistribution layer 1635, the plated land 1642, and the grid lead top pad 1632. In an illustrative example, the encapsulation 1646 can completely cover the integrated circuit 1636 and the top die 1670.

The pressure of forming the encapsulation 1646 can cause bowing of the leadframe 1802. Bowing is defined as a deformation of the leadframe 1802. The leadframe 1802 can include the terminal redistribution layer 1634 and the interior redistribution layer 1635 that can be supported by the support pad 1660. The support pad 1660 can provide mechanical support to prevent bowing of the terminal redistribution layer 1634 and the interior redistribution layer 1635.

Figure 22:
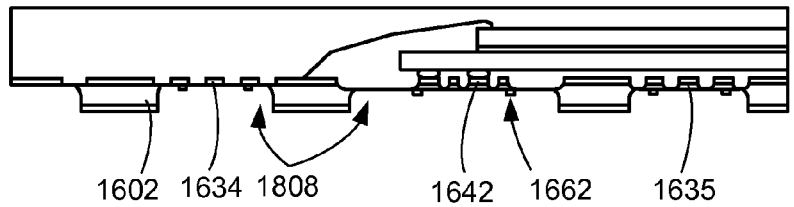
FIG. 22 is the structure of FIG. 21 in a removing phase.

Referring now to FIG. 22, therein is shown the structure of FIG. 21 in a removing phase. The removing phase can include a removal method for removing a portion of the leadframe 1802 of FIG. 18 of the integrated circuit packaging system 1600.

A portion of the leadframe 1802 at the leadframe bottom side 1804 of FIG. 18 can be removed in the partially removed bottom portion 1808. Removal of the portion of the leadframe 1802 in the partially removed bottom portion 1808 can form the grid lead 1602 and expose a bottom portion of the terminal redistribution layer 1634, the interior redistribution layer 1635, and the plated land 1642. Removal of the partially removed bottom portion 1808 can electrically separate the terminal redistribution layer 1634, the interior redistribution layer 1635, the plated land 1642, and the grid lead 1602.

The removing phase can include removing the support pad 1660 of FIG. 16 used to prevent bowing during the manufacturing process. For example, the etching in the removal phase can remove the support pad 1660 because the surface of the support pad 1660 is unprotected.

Removing the support pad 1660 can leave the support pad residue 1662 extended downward from the bottom surfaces of the terminal redistribution layer 1634, the interior redistribution layer 1635, and the plated land 1642. The interior redistribution layer 1635 and the plated land 1642 can include a portion of the conductive trace material and a portion of the leadframe material due to the half etching of the leadframe 1802.

It is understood that during the removing phase, a portion of the leadframe 1802 can be removed forming an indentation in the encapsulation 1646 beneath the interior redistribution layer 1635 and the plated land 1642 where the leadframe 1802 has been half etched. The encapsulation 1646 can extend below the interior redistribution layer 1635 and the plated land 1642 in the interior area 1624.

Figure 23:
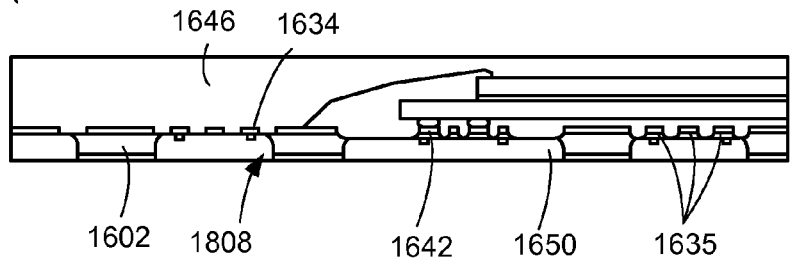
FIG. 23 is the structure of FIG. 22 in an applying phase.

Referring now to FIG. 23, therein is shown the structure of FIG. 22 in an applying phase. The applying phase can include an application method for forming the insulation layer 1650 on the structure of FIG. 22 of the integrated circuit packaging system 1600.

The insulation layer 1650 can be applied directly on the partially removed bottom portion 1808 including portions of the grid lead 1602, the terminal redistribution layer 1634, the interior redistribution layer 1635, and the encapsulation 1646. The insulation layer 1650 can protect bottom surfaces of the terminal redistribution layer 1634, the interior redistribution layer 1635, and the plated land 1642. The insulation layer 1650 can electrically isolate the grid lead 1602 and another of the grid lead 1602.

Figure 24:
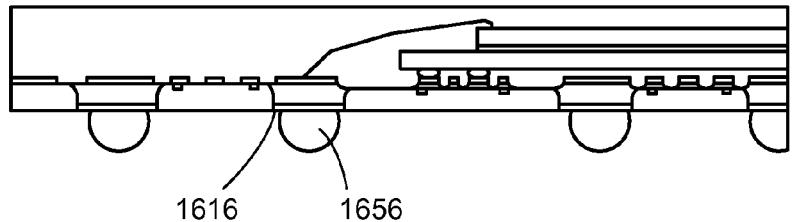
FIG. 24 is the structure of FIG. 23 in a connecting phase.

Referring now to FIG. 24, therein is shown the structure of FIG. 23 in a connecting phase. The connecting phase can include a connecting method for attaching the external connector 1656 of the integrated circuit packaging system 1600.

The connecting phase can include connecting the external connector 1656 on the grid lead bottom pad 1616. The external connector 1656 can include a solder bump, a metal bump, a solder ball, or a combination thereof.

Figure 25:
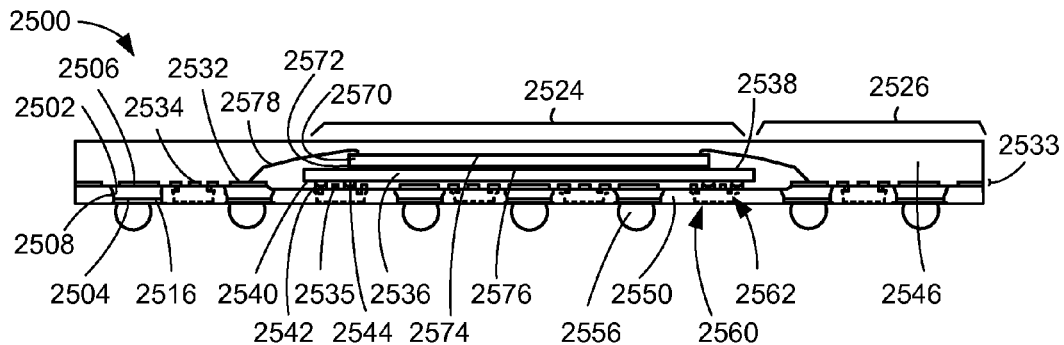
FIG. 25 is a cross-sectional view of an integrated circuit packaging system along line 16-16 of FIG. 17 in a fourth embodiment of the present invention.

Referring now to FIG. 25, therein is shown a cross-sectional view of an integrated circuit packaging system 2500 in a fourth embodiment of the present invention. The integrated circuit packaging system 2500 can include a leadframe lead array.

The integrated circuit packaging system 2500 can include a grid lead 2502. The grid lead 2502 is a structure that provides connectivity for electrical signals or electrical potential levels between the integrated circuit packaging system 2500 and an external system (not shown). For example, the grid lead 2502 can represent an interconnection including a terminal or a pad.

The grid lead 2502 can include a grid lead bottom side 2504 and a grid lead top side 2506 opposite the grid lead bottom side 2504. The grid lead 2502 can include a grid lead non-horizontal side 2508 extending between the grid lead bottom side 2504 and the grid lead top side 2506.

The grid lead 2502 can include a grid lead bottom pad 2516. The grid lead bottom pad 2516 is an attachment site for providing electrical connection to the bottom of the grid lead 2502. The grid lead bottom pad 2516 can be formed at the grid lead bottom side 2504.

The grid lead 2502 can include a grid lead top pad 2532. The grid lead top pad 2532 is an attachment site for providing electrical connection to the top of the grid lead 2502. The grid lead top pad 2532 can be formed at the grid lead top side 2506. For example, the grid lead bottom pad 2516 and the grid lead top pad 2532 can be a plating formed from a metal or metal alloy.

The integrated circuit packaging system 2500 can include a redistribution layer 2533. The redistribution layer 2533 can include a terminal redistribution layer 2534. The terminal redistribution layer 2534 is a structure that provides electrical connectivity between the grid lead 2502 and a semiconductor device. The terminal redistribution layer 2534 can route electrical connections or redistributes electrical signals from an integrated circuit 2536 to the grid lead 2502.

The integrated circuit 2536 is defined as a semiconductor device. The integrated circuit 2536 can include an inactive side 2538 and an active side 2540 opposite the inactive side 2538. For example, the integrated circuit 2536 can include a semiconductor device including a flipchip, a wire-bond chip, a silicon (Si) die, or other microelectronic device. The terminal redistribution layer 2534 can be routed between the grid lead 2502 and another of the grid lead 2502.

The integrated circuit packaging system 2500 can include a top die 2570. The top die 2570 is defined as a semiconductor device. For example, the top die 2570 can include a flipchip, a wire-bond chip, a silicon (Si) die, or other microelectronic device.

The top die 2570 can be mounted over the integrated circuit 2536 with a die adhesive layer 2572. The top die 2570 can include a top die active side 2574 and a top die inactive side 2576. The top die 2570 is mounted over the integrated circuit 2536 with the top die inactive side 2576 facing the integrated circuit 2536.

The top die 2570 can be connected to the grid lead 2502 with a die interconnect 2578. The die interconnect 2578 is defined as a structure providing electrical connectivity between the top die 2570 and the terminal redistribution layer 2534. For example, the die interconnect 2578 can be a bond wire, a conductive trace, a lead, or a combination thereof.

The integrated circuit packaging system 2500 can include a plated land 2542. The plated land 2542 is defined as an electrically conductive structure for mounting the integrated circuit 2536. The plated land 2542 can provide electrical connectivity between the integrated circuit 2536 and an external system.

The plated land 2542 can be connected to the integrated circuit 2536 with a land interconnect 2544. The land interconnect 2544 can be a structure for providing electrical connectivity between the integrated circuit 2536 and the plated land 2542. For example, the land interconnect 2544 can be a solder ball, metal bump, bond wire, lead, solder bump, or a combination thereof. In an illustrative example, the integrated circuit 2536 can include the land interconnect 2544.

The integrated circuit packaging system 2500 can include an interior area 2524 and a terminal area 2526. The interior area 2524 can be the portion of the integrated circuit packaging system 2500 under a periphery of the integrated circuit 2536. The interior area 2524 can be the portion of the integrated circuit packaging system 2500 surrounded by a periphery of a plurality of the plated land 2542.

The terminal area 2526 can be the portion of the integrated circuit packaging system 2500 outside the interior area 2524. The terminal redistribution layer 2534 can be formed in the terminal area 2526.

The integrated circuit packaging system 2500 can include the redistribution layer 2533. The redistribution 2533 can include an interior redistribution layer 2535 formed in the interior area 2524. The interior redistribution layer 2535 is a structure that provides electrical connectivity for distributing electrical signals from the semiconductor device in the interior area 2524.

The interior redistribution layer 2535 can provide electrical connectivity between the integrated circuit 2536, the plated land 2542, another of the plated land 2542, the grid lead 2502, and the terminal redistribution layer 2534. The terminal redistribution layer 2534 and the interior redistribution layer 2535 can be formed from the same structure, process, and material as the redistribution layer 2533.

The interior redistribution layer 2535 can be formed between the plated land 2542 and another of the plated land 2542. The terminal redistribution layer 2534 can form electrical connections with the interior redistribution layer 2535.

The integrated circuit 2536 can include the active side 2540 facing the plated land 2542. The integrated circuit 2536 can be mounted over the plated land 2542 with the land interconnect 2544 in direct contact with no intervening elements with the integrated circuit 2536 and the plated land 2542.

The integrated circuit packaging system 2500 can include an encapsulation 2546. The encapsulation 2546 is defined as a package cover providing protection hermetic seal.

The encapsulation 2546 can be formed in a variety of ways. For example, the encapsulation 2546 can be formed using transfer molding, injection molding, vacuum molding, film assist molding, or a combination thereof. The encapsulation 2546 can include materials such as a capillary underfill, a non-conductive paste (NCP), a molded underfill (MUF), or a combination thereof.

The encapsulation 2546 can be formed on the integrated circuit 2536, the grid lead 2502, the top die 2570, the die interconnect 2578, the terminal redistribution layer 2534, the interior redistribution layer 2535, the land interconnect 2544. The encapsulation 2546 can cover the top die active side 2574.

The formation of the encapsulation 2546 can cause the integrated circuit packaging system 2500 to bow or deform. The deformation or bowing can be reduced by forming a support pad 2560 on the bottom side of the integrated circuit packaging system 2500 for providing mechanical support during the formation of the encapsulation 2546.

The support pad 2560 can be directly under areas susceptible to deformation including the terminal redistribution layer 2534, the interior redistribution layer 2535, and the plated land 2542. The location of the support pad 2560 is indicated by the dashed lines below the terminal redistribution layer 2534, the interior redistribution layer 2535 and the plated land 2542.

The support pad 2560 can be removed in a later stage of manufacture, but upon close examination, the support pad 2560 can leave a support pad residue 2562 on the bottom surfaces of the terminal redistribution layer 2534, the interior redistribution layer 2535, and the plated land 2542. The support pad residue 2562 is defined as an irregular residual material from the support pad 2560 and on the structures previously supported by the support pad 2560 as a result of removing the support pad 2560. The support pad residue 2562 is exposed from planted land 2542 and the redistribution layer 2533 including the terminal redistribution layer 2534 and the interior redistribution layer 2535.

The support pad residue 2562 can form irregular bottom surfaces of the terminal redistribution layer 2534, the interior redistribution layer 2535, and the plated land 2542 characteristic of the removal of material. For example, the support pad residue 2562 can include etch marks, partial outlines of the support pad 2560, grooves, metal protrusions, or a combination thereof.

The integrated circuit packaging system 2500 can include an insulation layer 2550 for electrically protecting portions of the bottom surfaces of the terminal redistribution layer 2534 and the interior redistribution layer 2535. The insulation layer 2550 can include an insulation material including a passivation, a solder resist, an epoxy, or an adhesive.

The insulation layer 2550 can be formed between the grid lead 2502 and another of the grid lead 2502. The insulation layer 2550 can be formed on portions of the grid lead 2502, the terminal redistribution layer 2534, the interior redistribution layer 2535, and the encapsulation 2546. The insulation layer 2550 can electrically isolate the terminal redistribution layer 2534, the grid lead 2502, and the interior redistribution layer 2535.

The integrated circuit packaging system 2500 can include an external connector 2556, which is an electrically conductive structure for connecting the grid lead bottom pad 2516 and the external system. For example, the external connector 2556 can be formed with a conductive material including solder, a metal, or a metallic alloy.

It has been discovered that the present invention provides wire span reduction, package size reduction, cost savings, and elimination of complex bond layout by connecting the terminal redistribution layer 2534 with the interior redistribution layer 2535, the grid lead 2502, and the integrated circuit 2536.

It has been discovered that the present invention provides increased routing area and routing functionality by having the interior redistribution layer 2535 under the integrated circuit 2536. The interior redistribution layer 2535 can be used for routing electrical signals between the grid lead 2502, the plated land 2542, the terminal redistribution layer 2534, and the integrated circuit 2536.

It has been discovered that the present invention provides increased reliability by having the support pad 2560 positioned to reduce bowing during the molding of the encapsulation 2546. The regions around the terminal redistribution layer 2534, the interior redistribution layer 2535, and the plated land 2542 can bow down to the level of the grid lead bottom pad 2516 without support. The support pad 2560 provides mechanical support during molding to reduce the bowing of the terminal redistribution layer 2534, the interior redistribution layer 2535, and the plated land 2542 by up to 100 percent of the height of the support pad 2560.

Figure 26:
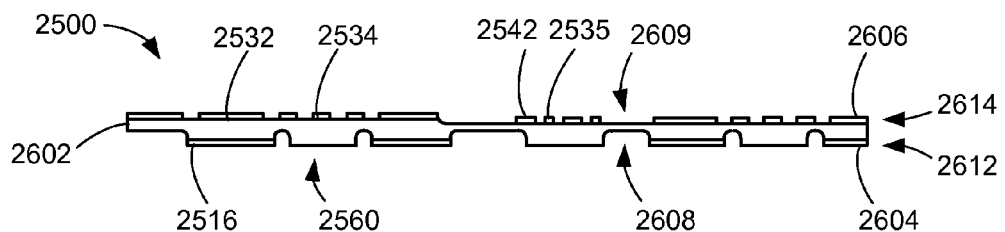
FIG. 26 is the structure of FIG. 25 in a forming phase of manufacture.

Referring now to FIG. 26, therein is shown the structure of FIG. 25 in a forming phase of manufacture. The forming phase can include a forming method for plating and etching the terminal redistribution layer 2534, the interior redistribution layer 2535, the support pad 2560, the grid lead bottom pad 2516, the grid lead top pad 2532, and the plated land 2542 on a leadframe 2602 of the integrated circuit packaging system 2500. The process depicted in FIG. 26 to FIG. 32 can represent the manufacturing steps for the integrated circuit packaging system 2500.

The leadframe 2602 is defined as a structure for mounting and connecting a semiconductor device thereto. The leadframe 2602 can include a leadframe bottom side 2604 and a leadframe top side 2606 opposite the leadframe bottom side 2604. The leadframe 2602 can be formed of an electrically conductive material including copper (Cu), another metal, or a metal alloy The leadframe 2602 can include the grid lead bottom pad 2516 formed by plating the leadframe bottom side 2604 with a bottom etch mask 2612 and removing a portion of the leadframe 2602 not protected by the bottom etch mask 2612. The bottom etch mask 2612 is a conductive trace material plated on the leadframe 2602 to define the location of the gird lead bottom pad 2516. The bottom etch mask 2612 can be formed from conductive material such as a metal or a metal alloy.

The leadframe 2602 can include the support pad 2560 formed by applying a support pad mask (not shown) on the leadframe bottom side 2604 and removing a portion of the leadframe 2602 not protected by the support pad mask. The support pad mask can be a protective material applied at the leadframe 2602 to define the location of the support pad 2560. The support pad mask can be removed after forming the support pad 2560. The support pad 2560 can be positioned in a location having a space gap greater than 0.65 mm.

The horizontal diameter of the support pad 2560 is smaller than the horizontal diameter of the grid lead 2502 to allow for removal of the support pad 2560. For example, the support pad 2560 can have a horizontal diameter between 50-100 μm. In another example, the grid lead 2502 can have a horizontal diameter of 350 μm or less.

A portion of the leadframe 2602 at the leadframe bottom side 2604 can be removed with an etching process to form a partially removed bottom portion 2608. As an illustrative example, the leadframe 2602 is shown as a structure pre-etched at the leadframe bottom side 2604.

The leadframe 2602 can include the terminal redistribution layer 2534, the interior redistribution layer 2535, the grid lead top pad 2532, and the plated land 2542 formed on the leadframe top side 2606. The terminal redistribution layer 2534, the interior redistribution layer 2535, the grid lead top pad 2532, and the plated land 2542 can be formed by plating the leadframe top side 2606 with a top etch mask 2614 and removing a portion of the leadframe 2602 not protected by the top etch mask 2614.

The top etch mask 2614 is a conductive trace material plated on the leadframe 2602 to define the location of the terminal redistribution layer 2534, the interior redistribution layer 2535, the grid lead top pad 2532, and the plated land 2542. The top etch mask 2614 can be formed from conductive material such as a metal or a metal alloy. A portion of the leadframe 2602 can be removed to form a partially removed top portion 2609.

The leadframe 2602 can have a portion removed on the leadframe top side 2606 in a variety of ways. For example, the leadframe 2602 can be half etched, partially etched, ground, stamped, coined, pressed, or a combination thereof in the interior area 2524 of FIG. 25 or the terminal area 2526 of FIG. 25.

In another example, the partially removed top portion 2609 can be formed by half etching the portion of the leadframe 2602 in the interior area 2524 surrounding the interior redistribution layer 2535, the plated land 2542, and the grid lead top pad 2532. In yet another example, if the interior area 2524 has been half etched, the grid lead 2502 can include an indentation on the half etched side facing the interior area 2524.

Figure 27:
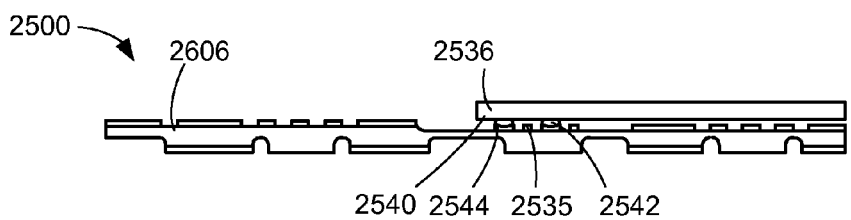
FIG. 27 is the structure of FIG. 26 in an attaching phase.

Referring now to FIG. 27, therein is shown the structure of FIG. 26 in an attaching phase. The attaching phase can include a die attach method for mounting the integrated circuit 2536 over the leadframe 2602 of FIG. 26 of the integrated circuit packaging system 2500.

The integrated circuit 2536 can be mounted over the plated land 2542, the land interconnect 2544, and the interior redistribution layer 2535. The land interconnect 2544 is in direct contact with no intervening elements with the integrated circuit 2536 and the plated land 2542. The integrated circuit 2536 can be mounted over the leadframe 2602 with the active side 2540 facing the leadframe top side 2606.

Figure 28:
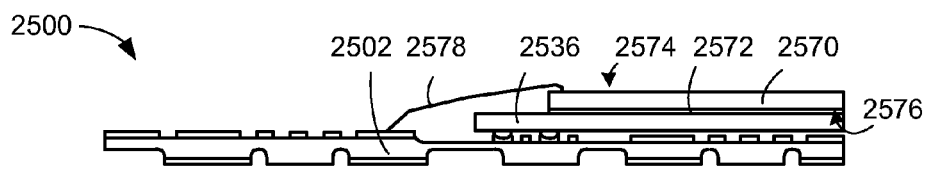
FIG. 28 is the structure of FIG. 27 in a mounting phase.

Referring now to FIG. 28, therein is shown the structure of FIG. 27 in a mounting phase. The mounting phase can include a top die mounting method for mounting the top die 2570 over the integrated circuit 2536 of the integrated circuit packaging system 2500.

The top die 2570 can be mounted over the integrated circuit 2536 with the die adhesive layer 2572. The top die inactive side 2576 can be facing the integrated circuit 2536. For example, the top die 2570 can include a wire bond die. The die interconnect 2578 can be electrically connected from the top die active side 2574 to the grid lead 2502.

Figure 29:
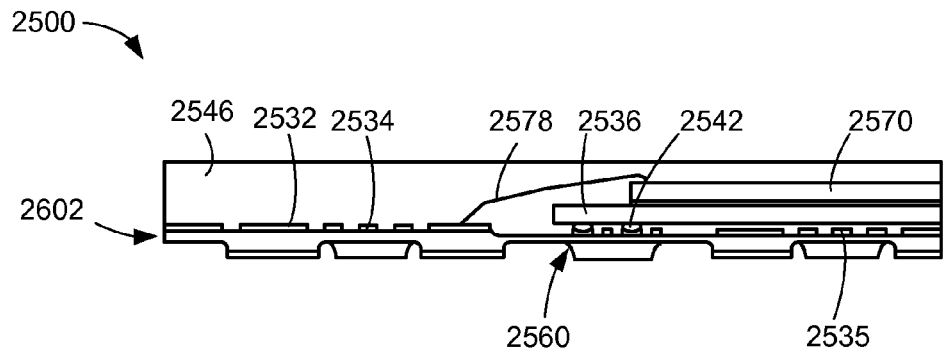
FIG. 29 is the structure of FIG. 28 in a molding phase.

Referring now to FIG. 29, therein is shown the structure of FIG. 28 in a molding phase. The molding phase can include a molding method for forming the encapsulation 2546 on the leadframe 2602 of the integrated circuit packaging system 2500.

The encapsulation 2546 can be molded over and in directly contact with the leadframe 2602, the terminal redistribution layer 2534, the integrated circuit 2536, the top die 2570, the die interconnect 2578, the interior redistribution layer 2535, the plated land 2542, and the grid lead top pad 2532. In an illustrative example, the encapsulation 2546 can completely cover the integrated circuit 2536 and the top die 2570.

The pressure of forming the encapsulation 2546 can cause bowing of the leadframe 2602. Bowing is defined as a deformation of the leadframe 2602. The leadframe 2602 can include the terminal redistribution layer 2534 and the interior redistribution layer 2535 that can be supported by the support pad 2560. The support pad 2560 can provide mechanical support to prevent bowing of the terminal redistribution layer 2534 and the interior redistribution layer 2535.

Figure 30:
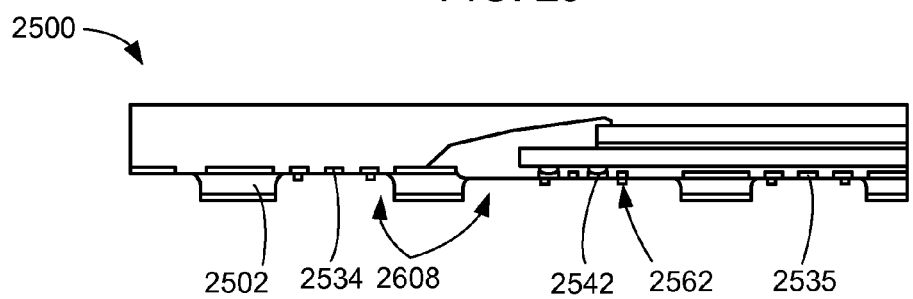
FIG. 30 is the structure of FIG. 29 in a removing phase.

Referring now to FIG. 30, therein is shown the structure of FIG. 29 in a removing phase. The removing phase can include a removal method for removing a portion of the leadframe 2602 of FIG. 26 of the integrated circuit packaging system 2500.

A portion of the leadframe 2602 at the leadframe bottom side 2604 of FIG. 26 can be removed in the partially removed bottom portion 2608. Removal of the portion of the leadframe 2602 in the partially removed bottom portion 2608 can form the grid lead 2502 and expose a bottom portion of the terminal redistribution layer 2534, the interior redistribution layer 2535, and the plated land 2542. Removal of the partially removed bottom portion 2608 can electrically separate the terminal redistribution layer 2534, the interior redistribution layer 2535, the plated land 2542, and the grid lead 2502.

The removing phase can include removing the support pad 2560 of FIG. 25 used to prevent bowing during the manufacturing process. For example, the etching in the removal phase can remove the support pad 2560 because the surface of the support pad 2560 is unprotected.

Removing the support pad 2560 can leave the support pad residue 2562 extended downward from the bottom surfaces of the terminal redistribution layer 2534, the interior redistribution layer 2535, and the plated land 2542. The interior redistribution layer 2535 and the plated land 2542 can include a portion of the conductive trace material and a portion of the leadframe material due to the half etching of the leadframe 2602.

It is understood that during the removing phase, a portion of the leadframe 2602 can be removed forming an indentation in the encapsulation 2546 beneath the interior redistribution layer 2535 and the plated land 2542 where the leadframe 2602 has been half etched. The encapsulation 2546 can extend below the interior redistribution layer 2535 and the plated land 2542 in the interior area 2524.

Figure 31:
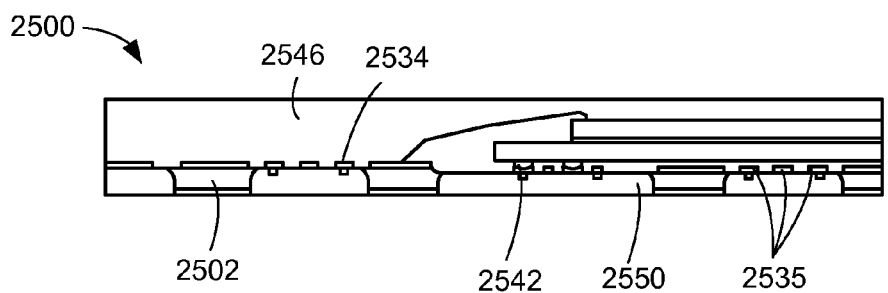
FIG. 31 is the structure of FIG. 30 in an applying phase.

Referring now to FIG. 31, therein is shown the structure of FIG. 30 in an applying phase. The applying phase can include an application method for forming the insulation layer 2550 on the structure of FIG. 30 of the integrated circuit packaging system 2500.

The insulation layer 2550 can be applied directly on the partially removed bottom portion 2608 of FIG. 26 including portions of the grid lead 2502, the terminal redistribution layer 2534, the interior redistribution layer 2535, and the encapsulation 2546. The insulation layer 2550 can protect bottom surfaces of the terminal redistribution layer 2534, the interior redistribution layer 2535, and the plated land 2542. The insulation layer 2550 can electrically isolate the grid lead 2502 and another of the grid lead 2502.

Figure 32:
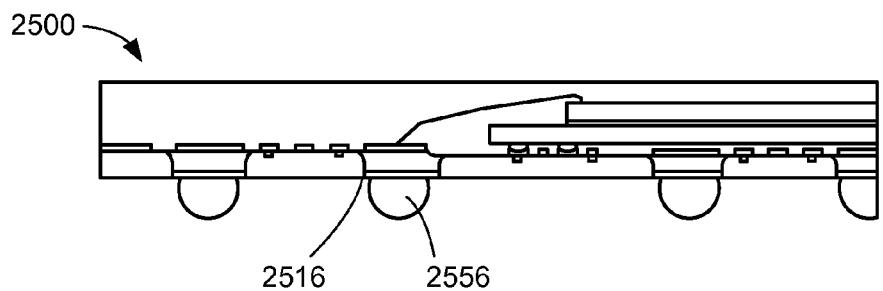
FIG. 32 is the structure of FIG. 31 in a connecting phase.

Referring now to FIG. 32, therein is shown the structure of FIG. 31 in a connecting phase. The connecting phase can include a connecting method for attaching the external connector 2556 of the integrated circuit packaging system 2500.

The connecting phase can include connecting the external connector 2556 on the grid lead bottom pad 2516. The external connector 2556 can include a solder bump, a metal bump, a solder ball, or a combination thereof.

Figure 33:
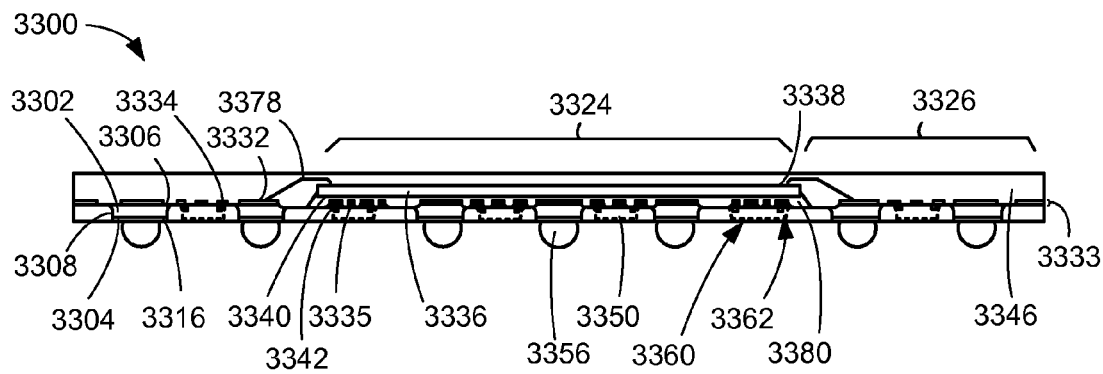
FIG. 33 is a cross-sectional view of an integrated circuit packaging system along line 16-16 of FIG. 17 in a fifth embodiment of the present invention.

Referring now to FIG. 33, therein is shown a cross-sectional view of an integrated circuit packaging system 3300 in a fifth embodiment of the present invention. The integrated circuit packaging system 3300 can include a leadframe lead array.

The integrated circuit packaging system 3300 can include a grid lead 3302. The grid lead 3302 is a structure that provides connectivity for electrical signals or electrical potential levels between the integrated circuit packaging system 3300 and an external system (not shown). For example, the grid lead 3302 can represent an interconnection including a terminal or a pad.

The grid lead 3302 can include a grid lead bottom side 3304 and a grid lead top side 3306 opposite the grid lead bottom side 3304. The grid lead 3302 can include a grid lead non-horizontal side 3308 extending between the grid lead bottom side 3304 and the grid lead top side 3306.

The grid lead 3302 can include a grid lead bottom pad 3316. The grid lead bottom pad 3316 is an attachment site for providing electrical connection to the bottom of the grid lead 3302. The grid lead bottom pad 3316 can be formed at the grid lead bottom side 3304

The grid lead 3302 can include a grid lead top pad 3332 for providing electrical connection to the top of the grid lead 3302. The grid lead top pad 3332 can be formed at the grid lead top side 3306. For example, the grid lead bottom pad 3316 and the grid lead top pad 3332 can be a plating formed from a metal or metal alloy.

The integrated circuit packaging system 3300 can include a redistribution layer 3333. The redistribution layer 3333 can include a terminal redistribution layer 3334. The terminal redistribution layer 3334 is a structure that provides electrical connectivity between the grid lead 3302 and a semiconductor device. The terminal redistribution layer 3334 can route electrical connections or redistributes electrical signals from an integrated circuit 3336 to the grid lead 3302.

The integrated circuit 3336 is defined as a semiconductor device. The integrated circuit 3336 can include an inactive side 3338 and an active side 3340 opposite the inactive side 3338. For example, the integrated circuit 3336 can include a semiconductor device including such as a wire-bond chip, a silicon (Si) die, or other microelectronic device. The terminal redistribution layer 3334 can be routed between the grid lead 3302 and another of the grid lead 3302.

The integrated circuit 3336 can be connected to the grid lead 3302 with a die interconnect 3378. The die interconnect 3378 can be a structure for providing electrical connectivity between the integrated circuit 3336 and the grid lead 3302. For example, the die interconnect 3378 can be a bond wire, a conductive trace, or a combination thereof.

The integrated circuit packaging system 3300 can include an interior area 3324 and a terminal area 3326. The interior area 3324 can be the portion of the integrated circuit packaging system 3300 under a periphery of the integrated circuit 3336.

The integrated circuit packaging system 3300 can include a plated land 3342. The plated land 3342 is as an electrically conductive structure formed in the interior area 3324.

The terminal area 3326 can be the portion of the integrated circuit packaging system 3300 outside the interior area 3324. The terminal redistribution layer 3334 can be formed in the terminal area 3326.

The integrated circuit packaging system 3300 can include a redistribution layer 3333. The redistribution layer 3333 can include an interior redistribution layer 3335 formed in the interior area 3324. The interior redistribution layer 3335 is a structure that provides electrical connectivity for distributing electrical signals from the semiconductor device in the interior area 3324.

The interior redistribution layer 3335 can provide electrical connectivity between the integrated circuit 3336, the die interconnect 3378, the plated land 3342, the grid lead 3302, and the terminal redistribution layer 3334. The terminal redistribution layer 3334 and the interior redistribution layer 3335 can be formed from the same structure, process, and material as the redistribution layer 3333.

The interior redistribution layer 3335 can be formed between the plated land 3342 and another of the plated land 3342. The terminal redistribution layer 3334 can form electrical connections with the interior redistribution layer 3335. The plated land 3342 can provide electrical connectivity between the interior redistribution layer 3335 and the grid lead 3302.

The integrated circuit 3336 can include the inactive side 3338 facing the plated land 3342. The integrated circuit 3336 can be mounted over the plated land 3342 with a die attach material layer 3380. The die attach material layer 3380 can be in directly contact with the integrated circuit 3336, the plated land 3342, the interior redistribution layer 3335, and the grid lead 3302.

The integrated circuit packaging system 3300 can include an encapsulation 3346. The encapsulation 3346 is defined as a package cover providing protection hermetic seal.

The encapsulation 3346 can be formed in a variety of ways. For example, the encapsulation 3346 can be formed using transfer molding, injection molding, vacuum molding, film assist molding, or a combination thereof. The encapsulation 3346 can include materials such as a capillary underfill, a non-conductive paste (NCP), a molded underfill (MUF), or a combination thereof.

The encapsulation 3346 can be formed on the integrated circuit 3336, the grid lead 3302, the die interconnect 3378, the terminal redistribution layer 3334, the interior redistribution layer 3335, and the die attach material layer 3380.

The formation of the encapsulation 3346 can cause the integrated circuit packaging system 3300 to bow or deform. The deformation or bowing can be reduced by forming a support pad 3360 on the bottom side of the integrated circuit packaging system 3300 for providing mechanical support during the formation of the encapsulation 3346.

The support pad 3360 can be directly under areas susceptible to deformation including the terminal redistribution layer 3334, the interior redistribution layer 3335, and the plated land 3342. The location of the support pad 3360 is indicated by the dashed lines below the terminal redistribution layer 3334, the interior redistribution layer 3335 and the plated land 3342.

The support pad 3360 can be removed in a later stage of manufacture, but upon close examination, the support pad 3360 can leave a support pad residue 3362 on the bottom surfaces of the terminal redistribution layer 3334, the interior redistribution layer 3335, and the plated land 3342. The support pad residue 3362 is defined as an irregular residual material from the support pad 3360 and on the structures previously supported by the support pad 3360 as a result of removing the support pad 3360. The support pad residue 3362 is exposed from planted land 3342 and the redistribution layer 3333 including the terminal redistribution layer 3334 and the interior redistribution layer 3335.

The support pad residue 3362 can form irregular bottom surfaces of the terminal redistribution layer 3334, the interior redistribution layer 3335, and the plated land 3342 characteristic of the removal of material. For example, the support pad residue 3362 can include etch marks, partial outlines of the support pad 3360, grooves, metal protrusions, or a combination thereof.

The integrated circuit packaging system 3300 can include an insulation layer 3350 for electrically protecting portions of the bottom surfaces of the terminal redistribution layer 3334 and the interior redistribution layer 3335. The insulation layer 3350 can include an insulation material including a passivation, a solder resist, an epoxy, or an adhesive.

The insulation layer 3350 can be formed between the grid lead 3302 and another of the grid lead 3302. The insulation layer 3350 can be formed on portions of the grid lead 3302, the terminal redistribution layer 3334, the interior redistribution layer 3335, the encapsulation 3346, and the die attach material layer 3380. The insulation layer 3350 can electrically isolate the terminal redistribution layer 3334, the grid lead 3302, and the interior redistribution layer 3335.

The integrated circuit packaging system 3300 can include an external connector 3356, which is an electrically conductive structure for connecting the grid lead bottom pad 3316 and the external system. For example, the external connector 3356 can be formed with a conductive material including solder, a metal, or a metallic alloy.

It has been discovered that the present invention provides wire span reduction, package size reduction, cost savings, and elimination of complex bond layout by connecting the terminal redistribution layer 3334 with the interior redistribution layer 3335, the grid lead 3302, and the integrated circuit 3336.

It has been discovered that the present invention provides increased routing area and routing functionality by having the interior redistribution layer 3335 under the integrated circuit 3336. The interior redistribution layer 3335 can be used for routing electrical signals between the grid lead 3302, the plated land 3342, the terminal redistribution layer 3334, and the integrated circuit 3336.

It has been discovered that the present invention provides increased reliability by having the support pad 3360 positioned to reduce bowing during the molding of the encapsulation 3346. The regions around the terminal redistribution layer 3334, the interior redistribution layer 3335, and the plated land 3342 can bow down to the level of the grid lead bottom pad 3316 without support. The support pad 3360 provides mechanical support during molding to reduce the bowing of the terminal redistribution layer 3334, the interior redistribution layer 3335, and the plated land 3342 by up to 100 percent of the height of the support pad 3360.

Figure 34:
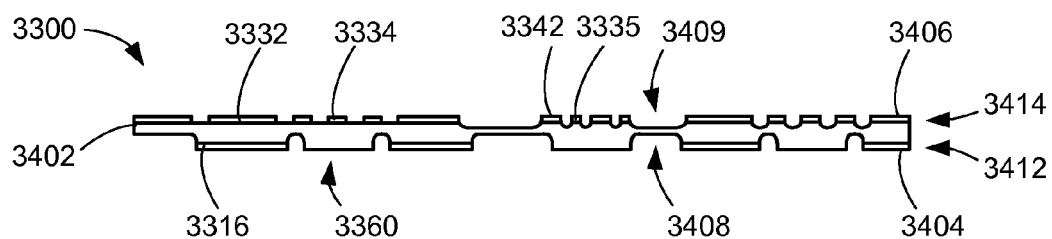
FIG. 34 is the structure of FIG. 33 in a forming phase of manufacture.

Referring now to FIG. 34, therein is shown the structure of FIG. 33 in a forming phase of manufacture. The forming phase can include a forming method for plating and etching the terminal redistribution layer 3334, the interior redistribution layer 3335, the support pad 3360, the grid lead bottom pad 3316, the grid lead top pad 3332, and the plated land 3342 on a leadframe 3402 of the integrated circuit packaging system 3300. The process depicted in FIG. 34 to FIG. 40 can represent the manufacturing steps for the integrated circuit packaging system 3300.

The leadframe 3402 is defined as a structure for mounting and connecting a semiconductor device thereto. The leadframe 3402 can include a leadframe bottom side 3404 and a leadframe top side 3406 opposite the leadframe bottom side 3404. The leadframe 3402 can be formed of an electrically conductive material including copper (Cu), another metal, or a metal alloy The leadframe 3402 can include the grid lead bottom pad 3316 formed by plating the leadframe bottom side 3404 with a bottom etch mask 3412 and removing a portion of the leadframe 3402 not protected by the bottom etch mask 3412. The bottom etch mask 3412 is a conductive trace material plated on the leadframe 3402 to define the location of the gird lead bottom pad 3316. The bottom etch mask 3412 can be formed from conductive material such as a metal or a metal alloy.

The leadframe 3402 can include the support pad 3360 formed by applying a support pad mask (not shown) on the leadframe bottom side 3404 and removing a portion of the leadframe 3402 not protected by the support pad mask. The support pad mask can be a protective material applied at the leadframe 3402 to define the location of the support pad 3360. The support pad mask can be removed after forming the support pad 3360. The support pad 3360 can be positioned in a location having a space gap greater than 0.65 mm.

The horizontal diameter of the support pad 3360 is smaller than the horizontal diameter of the grid lead 3302 to allow for removal of the support pad 3360. For example, the support pad 3360 can have a horizontal diameter between 50-100 µm. In another example, the grid lead 3302 can have a horizontal diameter of 350 µm or less.

A portion of the leadframe 3402 at the leadframe bottom side 3404 can be removed with an etching process to form a partially removed bottom portion 3408. As an illustrative example, the leadframe 3402 is shown as a structure pre-etched at the leadframe bottom side 3404.

The leadframe 3402 can include the terminal redistribution layer 3334, the interior redistribution layer 3335, the grid lead top pad 3332, and the plated land 3342 formed on the leadframe top side 3406. The terminal redistribution layer 3334, the interior redistribution layer 3335, the grid lead top pad 3332, and the plated land 3342 can be formed by plating the leadframe top side 3406 with a top etch mask 3414 and removing a portion of the leadframe 3402 not protected by the top etch mask 3414.

The top etch mask 3414 is a conductive trace material plated on the leadframe 3402 to define the location of the terminal redistribution layer 3334, the interior redistribution layer 3335, the grid lead top pad 3332, and the plated land 3342. The top etch mask 3414 can be formed from conductive material such as a metal or a metal alloy. A portion of the leadframe 3402 can be removed to form a partially removed top portion 3409.

The leadframe 3402 can have a portion removed on the leadframe top side 3406 in a variety of ways. For example, the leadframe 3402 can be half etched, partially etched, ground, stamped, coined, pressed, or a combination thereof in the interior area 3324 of FIG. 33 or the terminal area 3326 of FIG. 33.

In another example, the partially removed top portion 3409 can be formed by partially etching the portion of the leadframe 3402 in the interior area 3324 surrounding the interior redistribution layer 3335, the plated land 3342, and the grid lead top pad 3332. In another example, the partially removed top portion 3409 can be formed by partially etching the portion of the leadframe 3402 in the interior area 3324 and the terminal area 3326 surrounding the terminal redistribution layer 3334, the interior redistribution layer 3335, the plated land 3342, and the grid lead top pad 3332. In yet another example, if the interior area 3324 has been half etched, the grid lead 3302 can include an indentation on the half etched side facing the interior area 3324.

Figure 35:
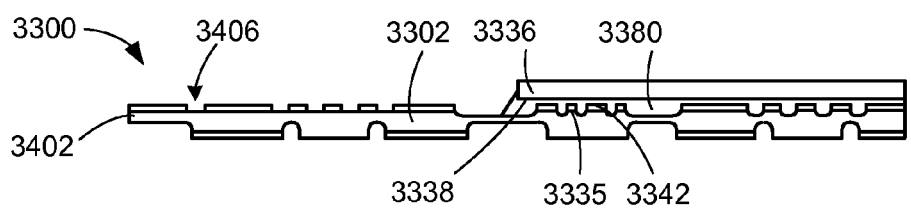
FIG. 35 is the structure of FIG. 34 in an attaching phase.

Referring now to FIG. 35, therein is shown the structure of FIG. 34 in an attaching phase. The attaching phase can include a die attach method for mounting the integrated circuit 3336 over the leadframe 3402 of the integrated circuit packaging system 3300.

The integrated circuit 3336 can be mounted over the plated land 3342 and the interior redistribution layer 3335 with the die attach material layer 3380. The die attach material layer 3380 is in direct contact with no intervening elements with the plated land 3342, the interior redistribution layer 3335, and the grid lead 3302. The integrated circuit 3336 can be mounted over the leadframe 3402 with the inactive side 3338 facing the leadframe top side 3406. For example, the integrated circuit 3336 can include a wire bond chip, a silicon die, or a combination thereof.

Figure 36:
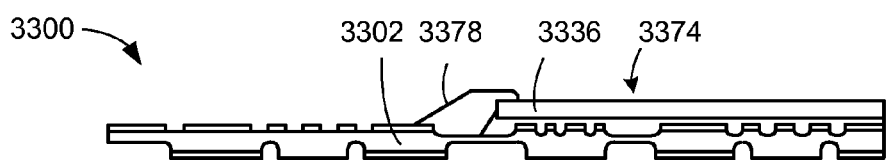
FIG. 36 is the structure of FIG. 35 in an interconnecting phase.

Referring now to FIG. 36, therein is shown the structure of FIG. 35 in an interconnecting phase. The interconnecting phase can include an interconnecting method for connecting the integrated circuit 3336 to the grid lead 3302 of the integrated circuit packaging system 3300.

The die interconnect 3378 can be electrically connected from a top die active side 3374 to the grid lead 3302. The integrated circuit 3336 can include a wire bond die.

Figure 37:
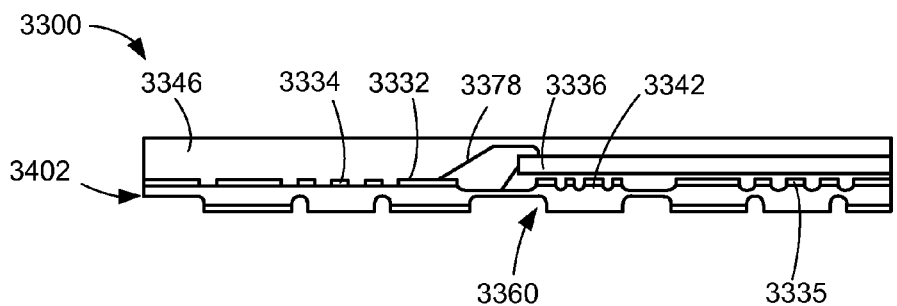
FIG. 37 is the structure of FIG. 36 in a molding phase.

Referring now to FIG. 37, therein is shown the structure of FIG. 36 in a molding phase. The molding phase can include a molding process for forming the encapsulation 3346 on the leadframe 3402 of the integrated circuit packaging system 3300.

The encapsulation 3346 can be molded over and in directly contact with the leadframe 3402, the terminal redistribution layer 3334, the integrated circuit 3336, the die interconnect 3378, the interior redistribution layer 3335, the plated land 3342, and the grid lead top pad 3332. In an illustrative example, the encapsulation 3346 can completely cover the integrated circuit 3336 and the die interconnect 3378.

The pressure of forming the encapsulation 3346 can cause bowing of the leadframe 3402. Bowing is defined as a deformation of the leadframe 3402. The leadframe 3402 can include the terminal redistribution layer 3334 and the interior redistribution layer 3335 that can be supported by the support pad 3360. The support pad 3360 can provide mechanical support to prevent bowing of the terminal redistribution layer 3334 and the interior redistribution layer 3335.

Figure 38:
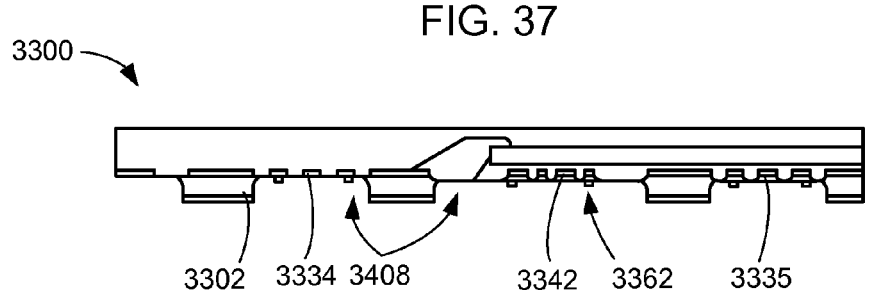
FIG. 38 is the structure of FIG. 37 in a removing phase.

Referring now to FIG. 38, therein is shown the structure of FIG. 37 in a removing phase. The removing phase can include a removal method for removing a portion of the leadframe 3402 of FIG. 34 of the integrated circuit packaging system 3300.

A portion of the leadframe 3402 at the leadframe bottom side 3404 of FIG. 34 can be removed in the partially removed bottom portion 3408. Removal of the portion of the leadframe 3402 in the partially removed bottom portion 3408 can form the grid lead 3302 and expose a bottom portion of the terminal redistribution layer 3334, the interior redistribution layer 3335, and the plated land 3342. Removal of the partially removed bottom portion 3408 can electrically separate the terminal redistribution layer 3334, the interior redistribution layer 3335, the plated land 3342, and the grid lead 3302.

The removing phase can include removing the support pad 3360 of FIG. 33 used to prevent bowing during the manufacturing process. For example, the etching in the removal phase can remove the support pad 3360 because the surface of the support pad 3360 is unprotected.

Removing the support pad 3360 can leave the support pad residue 3362 extended downward from the bottom surfaces of the terminal redistribution layer 3334, the interior redistribution layer 3335, and the plated land 3342. The interior redistribution layer 3335 and the plated land 3342 can include a portion of the conductive trace material and a portion of the leadframe material due to the half etching of the leadframe 3402.

It is understood that during the removing phase, a portion of the leadframe 3402 can be removed forming an indentation in the encapsulation 3346 beneath the interior redistribution layer 3335 and the plated land 3342 where the leadframe 3402 has been half etched. The encapsulation 3346 can extend below the interior redistribution layer 3335 and the plated land 3342 in the interior area 3324.

Figure 39:
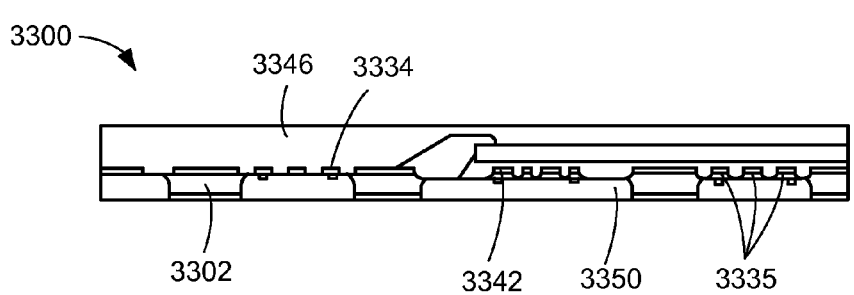
FIG. 39 is the structure of FIG. 38 in an applying phase.

Referring now to FIG. 39, therein is shown the structure of FIG. 38 in an applying phase. The applying phase can include an application method for forming the insulation layer 3350 on the structure of FIG. 38 of the integrated circuit packaging system 3300.

The insulation layer 3350 can be applied directly on the partially removed bottom portion 3408 of FIG. 34 including portions of the grid lead 3302, the terminal redistribution layer 3334, the interior redistribution layer 3335, and the encapsulation 3346. The insulation layer 3350 can protect bottom surfaces of the terminal redistribution layer 3334, the interior redistribution layer 3335, and the plated land 3342. The insulation layer 3350 can electrically isolate the grid lead 3302 and another of the grid lead 3302.

Figure 40:
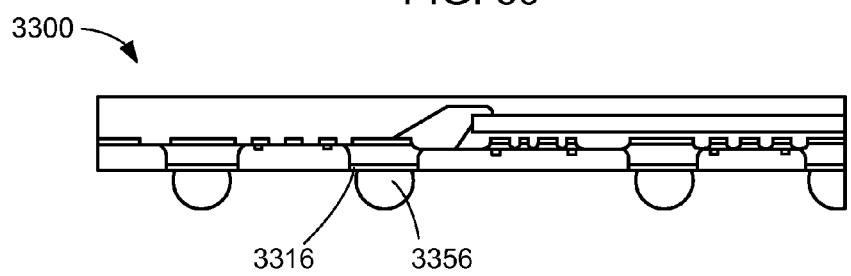
FIG. 40 is the structure of FIG. 39 in a connecting phase.

Referring now to FIG. 40, therein is shown the structure of FIG. 39 in a connecting phase. The connecting phase can include a connecting method for attaching the external connector 3356 of the integrated circuit packaging system 3300.

The connecting phase can include connecting the external connector 3356 on the grid lead bottom pad 3316. The external connector 3356 can include a solder bump, a metal bump, a solder ball, or a combination thereof.

Figure 41:
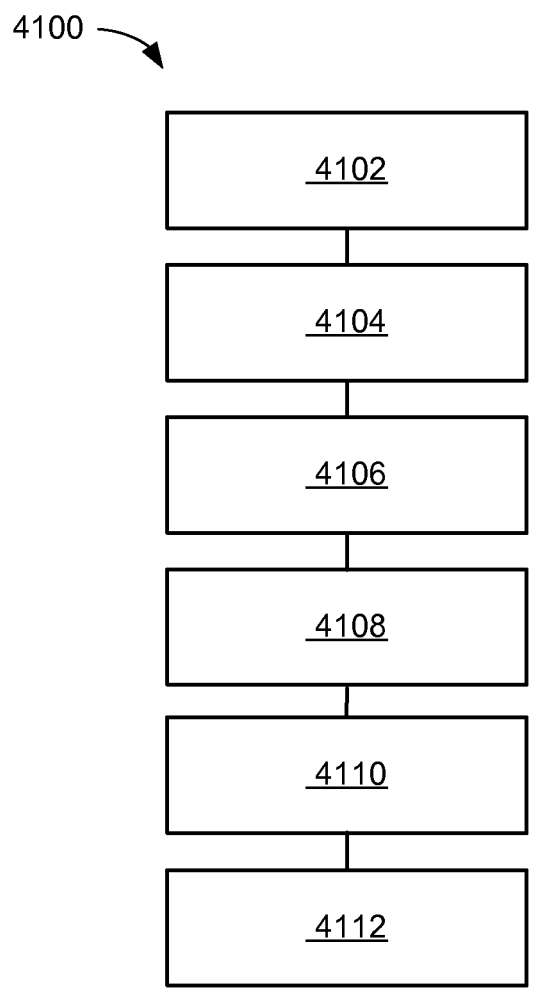
FIG. 41 is a flow chart of a method of manufacture of an integrated circuit packaging system in a further embodiment of the present invention.

Referring now to FIG. 41, therein is shown a flow chart of a method 4100 of manufacture of an integrated circuit packaging system in a further embodiment of the present invention. The method 4100 includes: providing a leadframe with a grid lead and a support pad in a block 4102; connecting a redistribution layer to the grid lead, the redistribution layer over the support pad in a block 4104; mounting an integrated circuit over the redistribution layer in a block 4106; applying an encapsulation on the redistribution layer, the redistribution layer in an interior area of the leadframe and the interior area under the integrated circuit in a block 4108; forming a support pad residue on the bottom surface of the redistribution layer by removing the support pad under the encapsulation and the interior redistribution layer in a block 4110; and forming an insulation layer on the support pad residue and the grid lead in a block 4112.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising: providing a leadframe with a grid lead, a plated land, and a support pad; connecting a first redistribution layer to the grid lead, forming a second redistribution layer over the support pad; mounting an integrated circuit over the second redistribution layer and the plated land, an active side of the integrated circuit facing the second redistribution layer, the second redistribution layer connecting the plated land to another plated land in an interior area between the integrated circuit and the support pad for distributing electric signals; applying an encapsulation directly on the first and second redistribution layers, the second redistribution layer separated from the active side of the integrated circuit exclusively by the encapsulation; forming a support pad residue on the bottom surface of the second redistribution layer by removing the support pad under the encapsulation and the second redistribution layer; and forming an insulation layer on the support pad residue and the grid lead.

2. The method as claimed in claim 1 wherein forming the second redistribution layer includes forming an interior redistribution layer in the interior area.

3. The method as claimed in claim 1 wherein forming the first redistribution layer includes forming a terminal redistribution layer outside the interior area.

4. The method as claimed in claim 1 wherein forming the support pad residue includes exposing the support pad residue from the second redistribution layer.

5. The method as claimed in claim 1 wherein mounting the integrated circuit includes mounting the integrated circuit over the plated land.

6. A method of manufacture of an integrated circuit packaging system comprising: providing a leadframe having a grid lead, a plated land, and a support pad; connecting a first redistribution layer to the grid lead, forming a second redistribution layer over the support pad and the grid lead; mounting an integrated circuit over the second redistribution layer and the plated land, an active side of the integrated circuit facing the second redistribution layer, the second redistribution layer connecting the plated land to another plated land in an interior area between the integrated circuit and the support pad for distributing electric signals; applying an encapsulation directly on the first and second redistribution layers, the second redistribution layer separated from the active side of the integrated circuit exclusively by the encapsulation; forming a support pad residue on the bottom surface of the second redistribution layer by removing the support pad under the encapsulation and the second redistribution layer; forming an insulation layer on the support pad residue and the grid lead; and connecting an external connector to the grid lead.

7. The method as claimed in claim 6 further comprising: forming the second redistribution layer includes forming an interior redistribution layer in the interior area, the interior redistribution layer electrically connected to the plated land; and forming the first redistribution layer includes forming a terminal redistribution layer outside the interior area, the terminal redistribution layer electrically connected to the interior redistribution layer.

8. The method as claimed in claim 6 further comprising: forming the first redistribution layer includes forming a terminal redistribution layer outside the interior area electrically connected to the grid lead; and forming the second redistribution layer includes forming an interior redistribution layer in the interior area for electrically connecting to the integrated circuit and the terminal redistribution layer.

\* \* \* \* \*